(12) United States Patent
Kang

(10) Patent No.: US 8,865,547 B2
(45) Date of Patent: Oct. 21, 2014

(54) METHODS OF FABRICATING A SEMICONDUCTOR DEVICE INCLUDING FINE PATTERNS

(75) Inventor: Chun Soo Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 13/618,428

(22) Filed: Sep. 14, 2012

(65) Prior Publication Data

US 2013/0196477 A1 Aug. 1, 2013

(30) Foreign Application Priority Data

Feb. 1, 2012 (KR) .......................... 10-2012-0010531

(51) Int. Cl.
*H01L 21/336* (2006.01)
(52) U.S. Cl.
USPC .......................................................... 438/259
(58) Field of Classification Search
USPC .................... 438/259, 262, 263, 264, 275
See application file for complete search history.

(56) References Cited

U.S. PATENT DOCUMENTS 7,732,279 B2 * 6/2010 Park .............................. 438/262
2010/0164114 A1 * 7/2010 Kang et al. .................... 257/773

* cited by examiner

*Primary Examiner* — Reema Patel
(74) *Attorney, Agent, or Firm* — William Park & Associates Patent Ltd.

(57) ABSTRACT

Methods of fabricating a semiconductor device are provided. The method includes forming active lines in a semiconductor substrate, forming contact lines generally crossing over the active lines, forming line-shaped etch mask patterns generally crossing over the active lines and the contact lines, etching the contact lines exposed by the line-shaped etch mask patterns to form contact separation grooves and to form contact patterns generally remaining at intersections between the line-shaped etch mask patterns and the active lines, etching the active lines exposed by the contact separation grooves to form active separation grooves that generally divide each of the active lines into a plurality of active patterns, forming gates that substantially intersect the active patterns, and forming bit lines electrically connected to the contact patterns.

29 Claims, 58 Drawing Sheets

— METHODS OF FABRICATING A
SEMICONDUCTOR DEVICE INCLUDING
FINE PATTERNS

CROSS-REFERENCES TO RELATED APPLICATIONS

The present application claims priority under 35 U.S.C 119(a) to Korean Application No. 10-2012-0010531, filed on Feb. 1, 2012, in the Korean Intellectual Property Office, which is incorporated herein by reference in its entirety set forth in full.

BACKGROUND

1. Technical Field

Embodiments of the present disclosure relate to methods of fabricating a semiconductor device. Additionally, an embodiment of this disclosure relates to methods of fabricating a semiconductor device including fine patterns.

As semiconductor devices become more highly integrated, various methods of realizing fine and small patterns have been continuously developed. For example, as semiconductor memory devices such as dynamic random access memory (DRAM) devices become increasingly integrated, cell patterns constituting memory cells of the DRAM devices have been shrunk to a minimum feature size of about 30 nanometers or less. However, it may be difficult to form the fine patterns having a minimum feature size of about 30 nanometers or less using a lithography process that employs a single exposure technique.

2. Related Art

According to general isolation technologies, a plurality of parallel line-shaped mask patterns are formed on a substrate, and predetermined portions of the line-shaped patterns are etched and removed using a cutting photo mask including hole-shaped opening patterns to form a plurality of separate active mask patterns which are two dimensionally arrayed on the substrate. For example, a plurality of parallel line-shaped patterns may be formed on a substrate using a spacer patterning technology, and predetermined portions of each of the line-shaped patterns may be removed using a cutting photo mask having hole-shaped opening patterns to form a plurality of hole patterns that divide each of the line-shaped patterns into a plurality of separated fine patterns.

In the fabrication of fine patterns using cutting photo masks with hole-shaped opening patterns, the size of the hole-shaped opening patterns has been continuously reduced with the increase in the integration density of semiconductor devices. Thus, there may be some limitations in successfully cutting the line-shaped patterns without any misalignment between the line-shaped patterns and the cutting photo mask. In the event that the cutting photo masks, having the hole-shaped opening patterns, are misaligned with the line-shaped patterns on the substrate, lengths of the fine patterns may be non-uniform degrading the reliability and/or the electrical characteristics of the semiconductor devices.

SUMMARY

Embodiments are directed to methods of fabricating a semiconductor device having fine patterns.

According to an embodiment, a method of fabricating a semiconductor device may include forming a first isolation layer in a semiconductor substrate to define active lines; forming contact lines generally crossing over the active lines and a first interlayer insulation layer substantially filling spaces between the contact lines; forming line-shaped etch mask patterns generally crossing over the active lines and the contact lines; etching the contact lines exposed by the line-shaped etch mask patterns to form contact separation grooves and to form contact patterns generally remaining at intersections between the line-shaped etch mask patterns and the active lines; etching the active lines exposed by the contact separation grooves to form active separation grooves that generally divide each of the active lines into a plurality of active patterns; forming a third isolation layer substantially filling the active separation grooves; forming gates that substantially intersect the active patterns; and forming bit lines generally crossing over the gates.

Additionally, according to an embodiment, a method of fabricating a semiconductor device may include forming a first isolation layer in a semiconductor substrate to define active lines; forming pseudo contact lines generally crossing over the active lines and a first interlayer insulation layer substantially filling spaces between the pseudo contact lines; forming line-shaped etch mask patterns generally crossing over the active lines and the pseudo contact lines; etching the pseudo contact lines exposed by the line-shaped etch mask patterns to form contact separation grooves and to form pseudo contact patterns generally remaining at intersections between the line-shaped etch mask patterns and the active lines; etching the active lines exposed by the contact separation grooves to form active separation grooves that generally divide each of the active lines into a plurality of active patterns; forming a third isolation layer substantially filling the active separation grooves; forming gates that substantially intersect the active patterns; removing the pseudo contact patterns to form contact holes; forming contact patterns substantially filling the contact holes; and forming bit lines connected to the contact patterns.

According to another embodiment, a method of fabricating a semiconductor device may include forming a first isolation layer in a semiconductor substrate to define cell active lines in a cell region of the semiconductor substrate and to define a peripheral active region in a peripheral circuit region of the semiconductor substrate; forming contact lines that generally cross over the cell active lines and a first interlayer insulation layer that substantially fills spaces between the contact lines and substantially covers the peripheral circuit region; forming line-shaped etch mask patterns generally crossing over the cell active lines and generally crossing over the contact lines in the cell region; etching the contact lines exposed by the line-shaped etch mask patterns to form contact separation grooves and to form contact patterns remaining at intersections between the line-shaped etch mask patterns and the cell active lines; etching the cell active lines exposed by the contact separation grooves to form active separation grooves that generally divide each of the cell active lines into a plurality of cell active patterns; forming a third isolation layer filling the active separation grooves; forming buried gates that substantially intersect the cell active patterns; selectively removing the first interlayer insulation layer in the peripheral circuit region to substantially expose the peripheral active region; forming a first peripheral gate layer substantially on the peripheral circuit region including the exposed peripheral active region; forming a bit line layer electrically connected to the contact patterns on an entire surface of the substrate including the first peripheral gate layer; and patterning the bit line layer and the first peripheral gate layer to form bit lines connected to the contact patterns in the cell region and to form a peripheral gate including a first peripheral gate and a second peripheral gate in the peripheral circuit region, wherein the first peripheral gate is a portion of the first peripheral gate layer and the second peripheral gate is a portion of the bit line layer.

According to still another embodiment, a method of fabricating a semiconductor device may include forming a first isolation layer in a semiconductor substrate to define cell active lines in a cell region of the semiconductor substrate and to define a peripheral active region in a peripheral circuit region of the semiconductor substrate; forming pseudo contact lines that generally cross over the cell active lines and a first interlayer insulation layer that substantially fills spaces between the pseudo contact lines and substantially covers the peripheral circuit region; forming line-shaped etch mask patterns generally crossing over the cell active lines and generally crossing over the pseudo contact lines in the cell region; etching the pseudo contact lines exposed by the line-shaped etch mask patterns to form contact separation grooves and to form pseudo contact patterns remaining at intersections substantially between the line-shaped etch mask patterns and the cell active lines; etching the cell active lines exposed by the contact separation grooves to form active separation grooves that generally divide each of the cell active lines into a plurality of cell active patterns; forming a third isolation layer filling the active separation grooves; forming buried gates that substantially intersect the cell active patterns; selectively removing the pseudo contact patterns to form contact holes; forming contact patterns substantially filling the contact holes; selectively removing the first interlayer insulation layer in the peripheral circuit region to substantially expose the peripheral active region; forming a first peripheral gate layer on the peripheral circuit region including the exposed peripheral active region; forming a bit line layer electrically connected to the contact patterns on an entire surface of the substrate including the first peripheral gate layer; and patterning the bit line layer and the first peripheral gate layer to form bit lines connected to the contact patterns in the cell region and to form a peripheral gate including a first peripheral gate and a second peripheral gate in the peripheral circuit region, wherein the first peripheral gate is a portion of the first peripheral gate layer and the second peripheral gate is a portion of the bit line layer.

Finally, according to an embodiment, a method of fabricating a semiconductor device may include forming active lines in a semiconductor substrate; forming contact lines substantially crossing over the active lines; forming line-shaped etch mask patterns substantially crossing over the active lines and the contact lines; etching the contact lines exposed by the line-shaped etch mask patterns to form contact separation grooves and to form contact patterns remaining at intersections substantially between the line-shaped etch mask patterns and the active lines; etching the active lines exposed by the contact separation grooves to form active separation grooves that generally divide each of the active lines into a plurality of active patterns; forming gates that substantially intersect the active patterns; and forming bit lines electrically connected to the contact patterns.

BRIEF DESCRIPTION OF THE DRAWINGS

Embodiments of the inventive concept will become more apparent in view of the attached drawings and accompanying detailed description.

DESCRIPTION OF THE EMBODIMENTS

Figure 1:
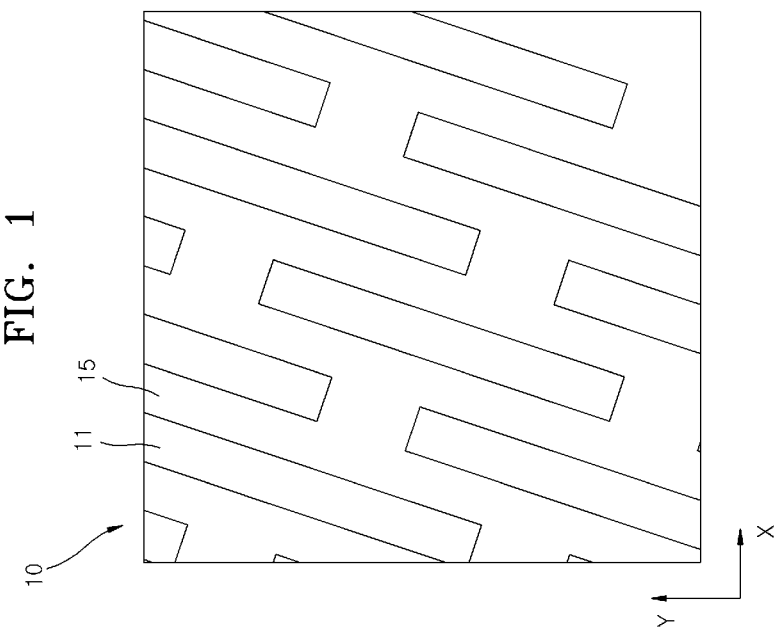
FIGS. 1 to 34 illustrate an example of a method of fabricating a semiconductor device including fine patterns according to an embodiment.

Various embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will convey the scope of the disclosure to those skilled in the art. The drawings are not necessarily to scale and in some instances, proportions may have been exaggerated in order to clearly illustrate features of the embodiments. The same reference numerals or the same reference designators denote the same elements throughout the specification.

Embodiments are described herein with reference to plan views and cross-section views that are schematic illustrations of idealized embodiments (and intermediate structures). As such, variations from the shapes of the illustrations as a result, for example, of manufacturing techniques and/or tolerances, are to be expected. Thus, these embodiments may not be construed as limited to the particular shapes of regions illustrated herein but may be construed to include deviations in shapes that result, for example, from manufacturing.

In this specification, specific terms have been used. The terms are used to describe the present invention, and are not used to qualify the sense or limit the scope of the present invention. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to embodiments described herein, a cutting photo mask for dividing line-shaped patterns disposed on a substrate into a plurality of fine patterns may also include a plurality of line-shaped opening patterns that are aligned to cross the line-shaped patterns. Thus, the overlay margin between the line-shaped patterns and the cutting photo mask may be increased to reduce process failures.

FIGS. 1 to 34 illustrate an example of a method of fabricating a semiconductor device including fine patterns according to an embodiment. Although the present embodiment is described in conjunction with cell active regions and bit line contacts of dynamic random access memory (DRAM) devices, the inventive concepts may also be equally applicable to other layers of DRAM devices or to other semiconductor devices besides the DRAM devices.

FIG. 1 is an example of a cell layout diagram illustrating a cell isolation structure in a cell region of a semiconductor device (e.g., a DRAM device) according to an embodiment.

Referring to FIG. 1, a cell isolation layout 10 of a DRAM device according to an embodiment may include a cell isolation region 15 defining cell active regions 11 on which cell transistors of memory cells may be disposed. Each of the cell active regions 11 may include a major axis and a minor axis. A unit cell of the DRAM device may be designed to have a cell layout area of $6F^2$ in order to increase the integration density of the DRAM device. The character "F" of the cell layout area $6F^2$ denotes a minimum feature size (MFS). In the $6F^2$ cell layout, the cell active regions 11 may be disposed such that the major axes of the cell active regions 11 are non-parallel with both an x-axis and a y-axis of an orthogonal coordinate system having the x-axis and the y-axis. For example, the cell active regions 11 may be disposed substantially in parallel with a generally diagonal line intersecting the y-axis at an angle of about 18 degrees.

As the DRAM devices are scaled down to have a minimum feature size of about 30 nanometers or less, it may be difficult to directly transfer cell active mask patterns corresponding to the cell active regions 11 onto a substrate or a wafer without any pattern distortions using a single exposure technique of a lithography process. Thus, in order to minimize the pattern distortions of the cell active regions 11, a plurality of generally parallel line-shaped patterns may be formed on a substrate using a photo mask, and predetermined portions of the line-shaped patterns may be cut using another photo mask to form a plurality of substantially fine patterns acting as the cell active mask patterns that correspond to the cell active regions 11.

Figure 2:
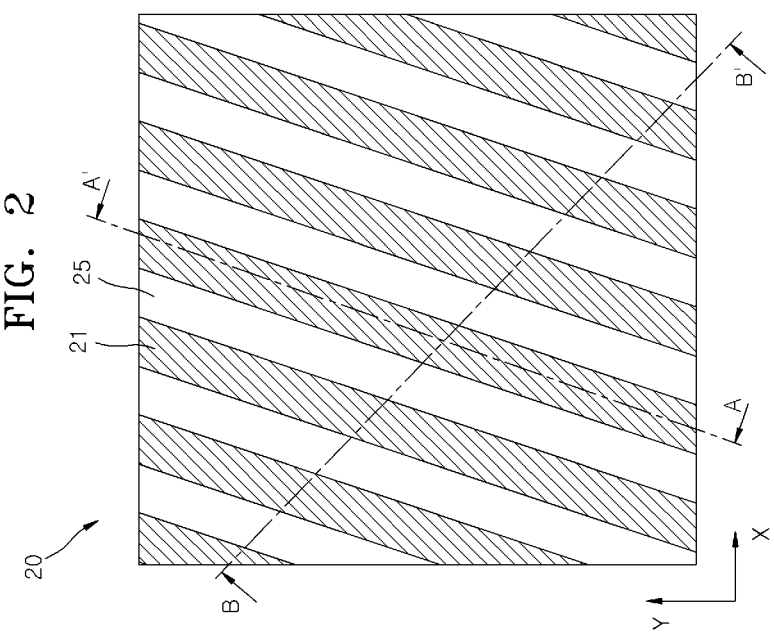
Figure 3:
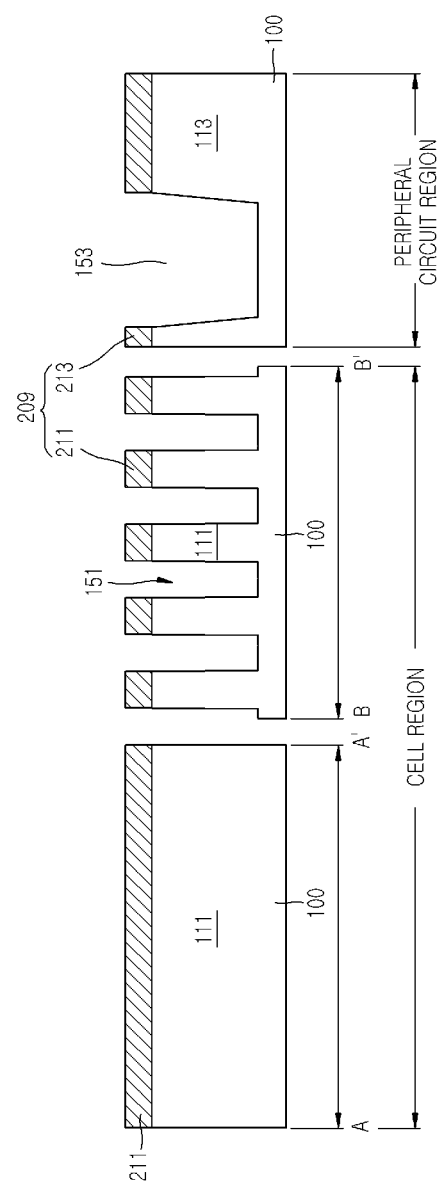

FIGS. 2 and 3 illustrate process steps of forming isolation trenches 151 and 153 in a semiconductor substrate 100.

FIG. 2 is a plan view illustrating a cell active line mask layout 20. As illustrated in FIG. 2, a cell active line mask layout 20 may be extracted by connecting the cell active regions 11 in each of the diagonal lines intersecting the y-axis of FIG. 1 to each other. Thus, the cell active line mask layout 20 may include a plurality of substantially parallel cell active line patterns 21. Space regions 25 between the cell active line patterns 21 may correspond to the cell isolation region (15 of FIG. 1).

FIG. 3 is a cross sectional view illustrating an example of process steps of forming isolation trenches 151 and 153 in a semiconductor substrate 100. The semiconductor substrate 100 may include a cell region in which cell circuits including memory cells are integrated and a peripheral circuit region in which peripheral circuits controlling the cell circuits are integrated. If the semiconductor device is a semiconductor memory device such as a DRAM device as described above, memory cell elements such as cell capacitors and/or cell transistors may be integrated in the cell region and peripheral circuit elements such as peripheral transistors constituting the peripheral circuits (e.g., sense amplifiers, row decoders, and/or column decoders, etc.) may be integrated in the peripheral circuit region.

FIG. 3 is a merged cross-sectional view including a cell cross sectional view taken along lines A-A' and B-B' of FIG. 2 and a peripheral circuit cross sectional view. Referring to FIG. 3, a trench etch mask 209 for defining active regions may be formed on a semiconductor substrate 100.

The trench etch mask 209 may be formed to include a first trench etch mask 211 in the cell region and a second trench etch mask 213 in the peripheral circuit region. Specifically, a trench etch mask layer and a photoresist layer may be sequentially formed on the semiconductor substrate 100, for example, a silicon substrate. The cell active line mask layout 20 of FIG. 2 may be transferred onto the photoresist layer in the cell region, and an additional mask layout may be transferred onto photoresist layer in the peripheral circuit region. The photoresist layer may be patterned using a develop process, and the trench etch mask layer may be etched using the patterned photoresist layer as an etch mask. The patterned photoresist layer may be then removed. As a result, the trench etch mask 209 may be formed to include the first trench etch mask 211 in the cell region and the second trench etch mask 213 in the peripheral circuit region. The first trench etch mask 211 including fine line patterns (e.g., the cell active line patterns 21 of FIG. 2) may be formed using a fine pattern formation technology such as a spacer patterning technology (SPT) that is appropriate for formation of a line and space array.

The peripheral circuit region may include relatively large sized patterns as compared with the cell region. Thus, the spacer patterning technology (SPT) may not be applied to the peripheral circuit region. That is, the first trench etch mask 211 and the second trench etch mask 213 may be independently formed using two separated exposure processes in order to apply the spacer patterning technology (SPT) to only the cell region. In some exemplary embodiments, the first trench etch mask 211 having a line and space array may be formed using a double patterning technology (DPT), a double exposure technology (DET), a lithography-lithography-etch (LLE) technology or a lithography-etch-lithography-etch (LELE) technology instead of the spacer patterning technology (SPT).

Subsequently, the semiconductor substrate 100 may be etched using the trench etch mask 209 as an etch mask, thereby first forming isolation trenches 151 in the cell region and then a second isolation trench 153 in the peripheral circuit region. The first isolation trenches 151 may be formed to define cell active lines 111 corresponding to the cell active line patterns 21 illustrated in FIG. 2, and the second trench 153 may be formed to define peripheral active regions 113. Some portions of Each of the cell active lines 111 defined by the line-shaped first trenches 151 may be cut in a subsequent process, thereby forming a plurality of fine patterns such as the cell active regions 11 illustrated in FIG. 1. In contrast, each of the peripheral active regions 113 may not be cut and/or divided into a plurality of fine patterns in a subsequent process.

Figure 4:
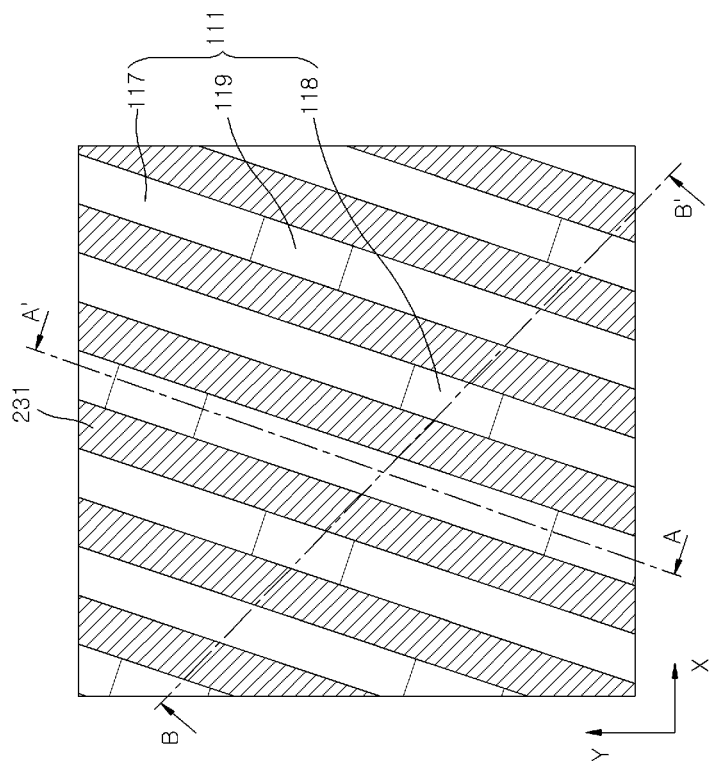
Figure 5:
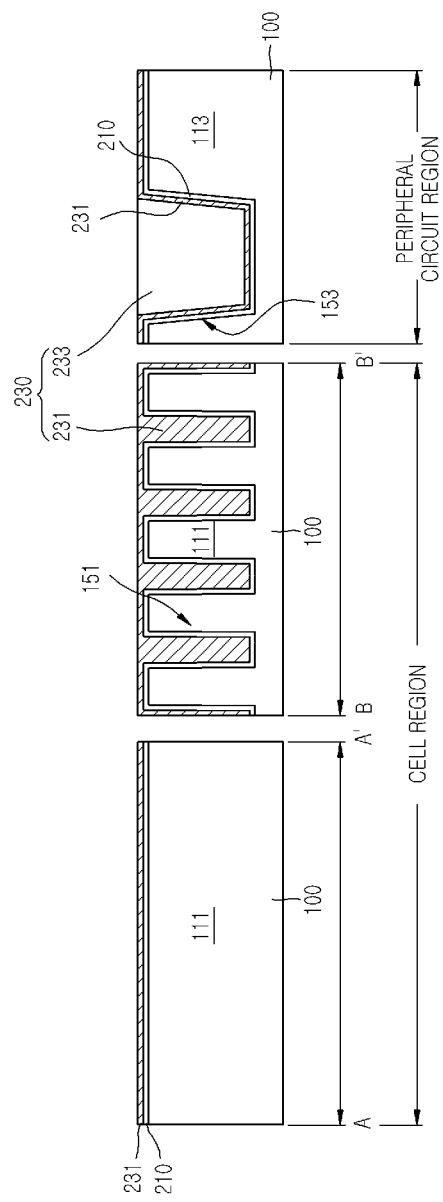

FIGS. 4 and 5 illustrate an example of process steps of forming an isolation layer 230 in a semiconductor substrate 100. FIG. 4 is a plan view illustrating an array layout of cell active lines 111 and first isolation layers 231 in a cell region, and FIG. 5 is a merged cross-sectional view including a cell cross sectional view taken along lines A-A' and B-B' of FIG. 4 and a peripheral circuit cross sectional view.

Referring to FIGS. 4 and 5, a trench liner 210 may be formed on bottom surfaces and sidewalls of the first and second trenches 151 and 153. The trench liner 210 may be formed of an insulation layer. The trench liner 210 may be formed by oxidizing the bottom surfaces and the sidewalls of the first and second trenches 151 and 153, respectively. For example, the trench liner 210 may be formed by thermally oxidizing the bottom surfaces and the sidewalls of the first and second trenches 151 and 153, respectively. That is, the trench liner 210 may be formed of a thermal oxide layer. The trench liner 210 may be thinly formed. For example, the trench liner 210 may be formed to a thickness of about several angstroms (Å), about several ten angstroms (Å) or about several hundred angstroms (Å).

After the trench liner 210 is formed, an isolation layer 230 may be formed substantially on the substrate including the trench liner 210. The isolation layer 230, for example, an insulation layer may be formed to substantially fill the first and second trenches 151 and 153, respectively. In order to substantially fill both the first trenches 151 and the second trench 153 wider than the first trenches 151 with the isolation layer 230, the isolation layer 230 in the cell region and the isolation layer 230 in the peripheral circuit region may be formed having different structures from each other.

In an embodiment, the first trenches 151 may be filled with a first isolation layer 231 including a single-layered insulation material such as a silicon nitride layer, and the second trench 153 may be filled with the first isolation layer 231, the first isolation layer conforming to and formed substantially in the second trench 153 and a second isolation layer 233 substantially filling the second trench 153 substantially surrounded by the first isolation layer 231. The second isolation layer 233 may be formed of a generally flowable insulation layer having a gap filing property, for example, a spin on dielectric (SOD) layer, etc. Thus, the second trench 153 may be filled with a multi-layered insulation material, whereas the first trenches 151 may be filled with a single-layered insulation material. That is, the first isolation layer 231 may be formed to fill the first trenches 151 and to conform to and substantially cover the bottom surface and the sidewalls of the second trench 153, and the second isolation layer 233 may be formed substantially on the first isolation layer 231 to substantially fill the second trench 153 generally surrounded by the first isolation layer 231. In the event that the second isolation layer 233 is formed of a spin on dielectric (SOD) layer, the SOD layer may be densified using an annealing process and the densified SOD layer (substantially, corresponding to a densified silicon oxide layer) may be then planarized to form the first and second isolation layers 231 and 233, respectively, filling the second trench 153. The planarization process may be performed until a top surface of the semiconductor substrate 100 substantially outside the first and second trenches 151 and 153, respectively, is exposed. Alternatively, the planarization process may be performed such that a portion of the first isolation layer 231 remains generally on the top surface of the semiconductor substrate 100 substantially outside the first and second trenches 151 and 153, respectively, to generally protect the semiconductor substrate 100.

The first isolation layer 231 may be formed of an insulation material having an etch selectivity with respect to an interlayer insulation layer that may be formed on the semiconductor substrate 100 in a subsequent process. In an embodiment, the first isolation layer 231 may be formed of a silicon nitride layer to serve as an etch stop layer and/or to generally minimize the etch damage applied to the semiconductor substrate 100 while the interlayer insulation layer is patterned using an etching process.

Referring again to FIG. 4, each of the cell active lines 111 defined by the first isolation layers 231 may be divided into the plurality of cell active regions 11, illustrated in FIG. 1, in a subsequent process. That is, each of the cell active lines 111 may include cell active region portions 117 and separation portions 118 or 119 generally between the cell active region portions 117.

The cell active regions 11 may be formed by forming a cutting mask pattern (not shown) having cutting holes substantially exposing the separation portions 118 or 119 of the cell active lines 111 on the semiconductor substrate including the isolation layer 230 and by selectively etching the substantially exposed separation portions 118 or 119 using the cutting mask pattern as an etch mask to substantially keep the cell active region portions 117 separated from each other.

When the cutting mask pattern having the cutting holes substantially exposing the separation portions 118 and 119 is formed generally on the semiconductor substrate, there may be some difficulties in forming the cutting mask pattern. For example, as the semiconductor devices are scaled down to have a minimum feature size of about 30 nanometers or less, a pitch size of the separation portions 118 and 119 may be reduced. Thus, it may be difficult to directly transfer the cutting holes exposing the separation portions 118 or 119 onto the semiconductor substrate without any pattern distortions using a single exposure technique of a lithography process. Accordingly, to overcome the disadvantages of the single exposure technique, a double patterning technology (DPT) utilizing two photo masks may be used to form the cell active regions 11, minimizing pattern distortions. That is, odd-numbered separation portions 118 (e.g., first separation portions) may be exposed by first cutting holes that may be formed using a first cutting photo mask, and even-numbered separation portions 119 (second separation portions) may be exposed by second cutting holes that may be formed using a second cutting photo mask.

As described above, a fine pattern formation technology such as the DPT may utilize two separated cutting photo masks. Thus, the DPT may require two separated exposure steps and a careful alignment between the first cutting photo mask and the second cutting photo mask, thereby increasing fabrication costs and process failure probabilities. As a result, uniformity of the cutting holes may be degraded to cause non-uniformity of the length of the cell active region portions 117, and an overlay margin (e.g., an alignment margin) between the cell active region portions 117 (e.g., cell active regions 11) and buried gates and/or bit lines formed in the subsequent processes may also be reduced.

The inventive concepts may provide methods of selectively removing the separation portions 118 and 119 even without the use of cutting photo masks that include hole-shaped opening patterns that correspond to the cutting holes exposing the separation portions 118 and 119.

Figure 6:
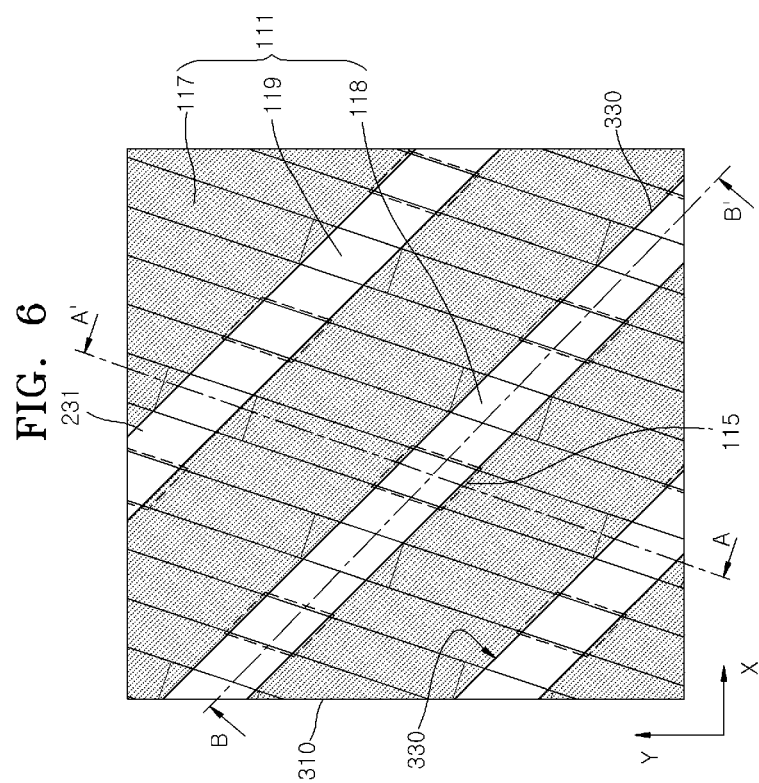
Figure 7:
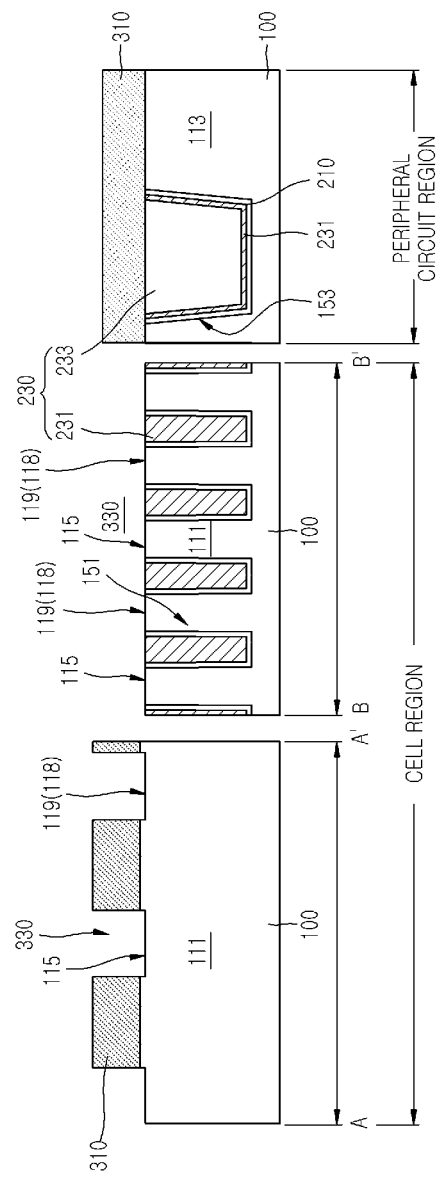

FIGS. 6 and 7 illustrate an example of process steps for forming line-shaped contact grooves 330 in a first interlayer insulation layer 310. FIG. 6 is a plan view illustrating an array layout of line-shaped contact grooves 330 in a cell region, and FIG. 7 is a merged cross-sectional view including a cell cross sectional view taken along lines A-A' and B-B' of FIG. 6 and a peripheral circuit cross sectional view.

Referring to FIGS. 6 and 7, after planarization of the isolation layer 230 substantially filling the first and second trenches 151 and 153, respectively, a first interlayer insulation layer 310 may be formed generally on the semiconductor substrate 100. The first interlayer insulation layer 310 may be formed to include an insulation material (e.g., a silicon oxide layer) having an etch selectivity with respect to the first isolation layer 231. This may be for preventing the first isolation layer 231 in the cell region from being over etched or damaged while the first interlayer insulation layer 310 may be etched and patterned in a subsequent process.

After formation of the first interlayer insulation layer 310, the first interlayer insulation layer 310 may be etched to form a plurality of line-shaped contact grooves 330 in the cell region. The line-shaped contact grooves 330 may be formed to substantially cross over the cell active lines 111. A layout of the line-shaped contact grooves 330 may be extracted from a layout of the cell active lines 111 illustrated in FIG. 4. That is, the separation portions 118 and 119 of the cell active lines 111 may be connected to create generally diagonal lines substantially intersecting the cell active lines 111, and the diagonal lines connecting the separation portions 118 and 119 may be changed into generally line-shaped rectangular patterns corresponding to the line-shaped contact grooves 330 illustrated in FIG. 6. The line-shaped contact grooves 330 may include odd-numbered grooves and even-numbered grooves. The odd-numbered grooves of the line-shaped contact grooves 330 may be formed to generally expose the first separation portions 118, and the even-numbered grooves of the line-shaped contact grooves 330 may be formed to generally expose the second separation portions 119.

The line-shaped contact grooves 330 may be formed to extend in a direction intersecting the cell active lines 111, as illustrated in FIG. 6. Thus, the line-shaped contact grooves 330 may be formed to cross over central portions of the cell active region portions 117. For example, the line-shaped contact grooves 330 may be formed to generally expose the central portions of the cell active region portions 117. The exposed central portions of the cell active region portions 117 may correspond to bit line contact regions 115.

In order to form the line-shaped contact grooves 330 in the cell region, a cutting photo mask having the layout of FIG. 6 may be manufactured and the first interlayer insulation layer 310 may be patterned using an exposure process utilizing the cutting photo mask and an etching process.

Figure 8:
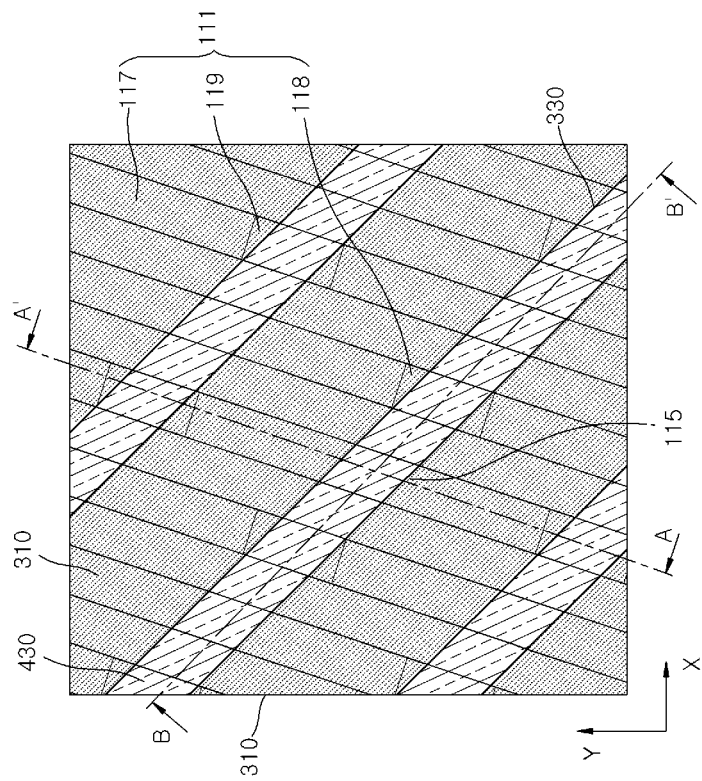
Figure 9:
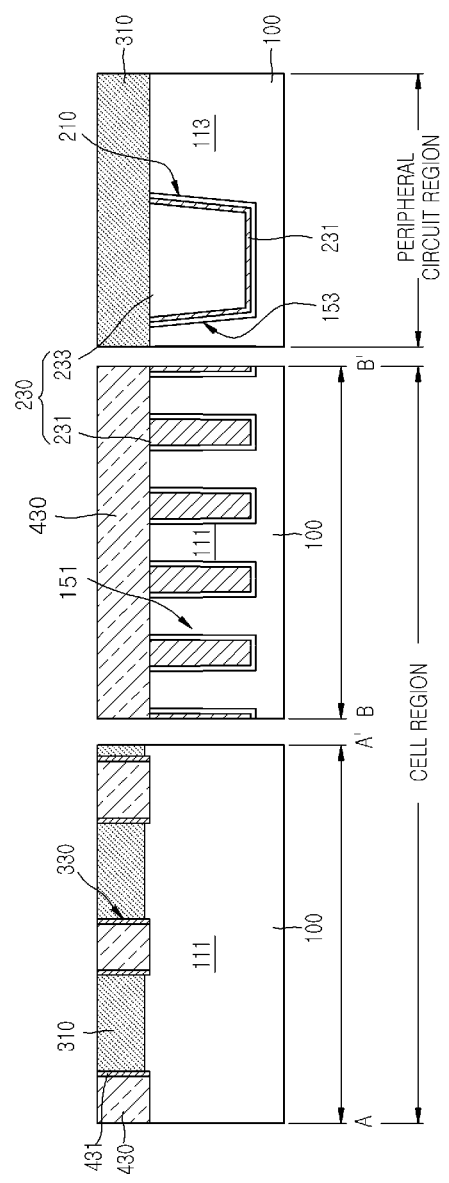

FIGS. 8 and 9 illustrate process steps of forming contact lines 430 in the line-shaped contact grooves 330. FIG. 8 is a plan view illustrating an array layout of contact lines 430 in the cell region, and FIG. 9 is a merged cross-sectional view including a cell cross sectional view taken along lines A-A' and B-B' of FIG. 8 and a peripheral circuit cross sectional view.

Referring to FIGS. 8 and 9, a spacer insulation layer may be conformed to and on the semiconductor substrate including the line-shaped contact grooves 330. The spacer insulation layer may be anisotropically etched to form first spacers 431 on sidewalls of the line-shaped contact grooves 330 and to generally expose the bit line contact regions 115 and the separation portions 118 and 119. Subsequently, a conductive layer may be deposited substantially on the substrate including the first spacers 431, and the conductive layer may be planarized to form contact lines 430 in respective line-shaped contact grooves 330. The conductive layer may be planarized using a chemical mechanical polishing (CMP) process. The conductive layer may be formed to include a doped polysilicon layer and/or a metal layer (e.g., a tungsten (W) layer or a titanium nitride (TiN) layer, etc.).

Figure 10:
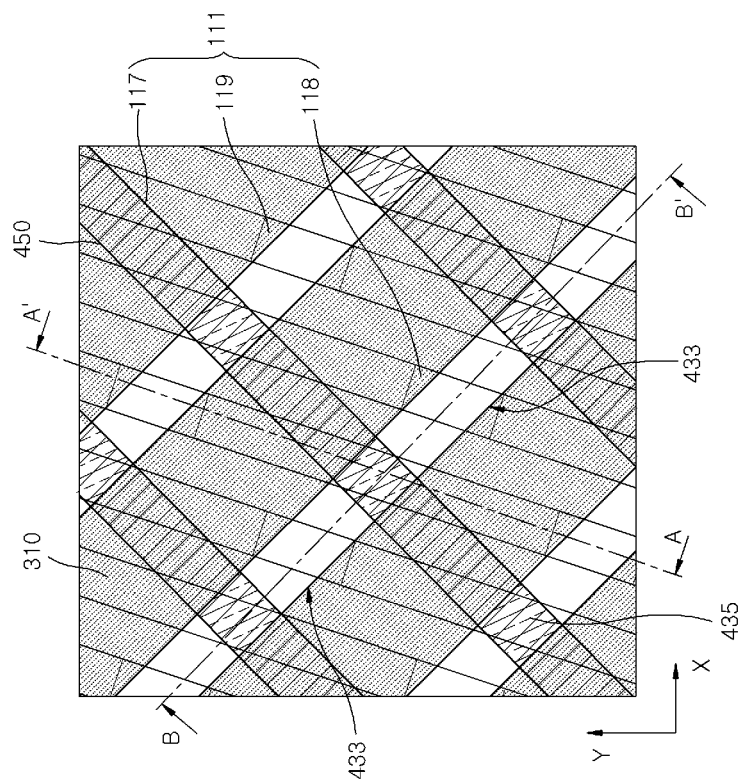
Figure 11:
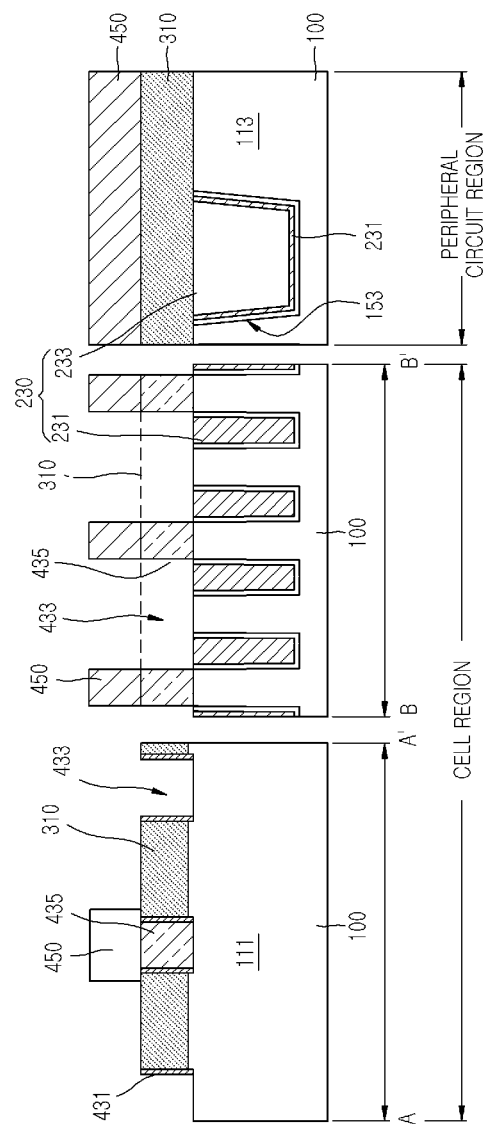

FIGS. 10 and 11 illustrate process steps of forming contact separation mask patterns 450. FIG. 10 is a plan view illustrating an array layout of contact separation mask patterns 450 in the cell region, and FIG. 11 is a merged cross-sectional view including a cell cross sectional view taken along lines A-A' and B-B' of FIG. 10 and a peripheral circuit cross sectional view.

Referring to FIGS. 10 and 11, contact separation mask patterns 450 (e.g., line-shaped etch mask patterns) may be formed generally on the substrate including the contact lines 430 (see FIG. 8). The contact separation mask patterns 450 may be formed to extend in a direction intersecting the contact lines 430. For example, the contact separation mask patterns 450 may be formed to be perpendicular or generally perpendicular to the contact lines 430. A layout of the contact separation mask patterns 450 may be extracted and/or generated from a layout of the contact lines 430 illustrated in FIG. 8. That is, the bit line contact regions 115 (see FIG. 7) may be connected to create diagonal or generally diagonal lines intersecting the contact lines 430 at a right angle or generally a right angle, and the substantially diagonal lines connecting the bit line contact regions 115 may be changed into line-shaped rectangular patterns or substantial rectangular patterns corresponding to the contact separation mask patterns 450 illustrated in FIG. 10.

To form the contact separation mask patterns 450, an insulation layer may be formed to generally cover the first interlayer insulation layer 310 and the contact lines 430 (see FIG. 9), and the insulation layer may be patterned using a lithography process utilizing a photo mask having the layout of the contact separation mask patterns 450 and an etching process. The contact separation mask patterns 450 may be formed of an insulation material having an etch selectivity with respect to the semiconductor substrate 100 (e.g., a silicon substrate), the contact lines 430 (e.g., a doped polysilicon layer) and the first interlayer insulation layer 310 (e.g., a silicon oxide layer). For example, the contact separation mask patterns 450 may be formed to include a silicon nitride layer, etc.

The contact lines 430 (see FIG. 9) may be etched using the contact separation mask patterns 450 as an etch mask. The etching process applied to the contact lines 430 may selectively remove portions of the contact lines 430 exposed by the contact separation mask patterns 450 because the contact separation mask patterns 450 has an etch selectivity with respect to the contact lines 430. The etching process applied to the contact lines 430 may be performed using a dry etching process. While the contact lines 430 are etched using the contact separation mask patterns 450 as an etch mask, the first interlayer insulation layer 310 (e.g., a silicon oxide layer) may not be over-etched because the first interlayer insulation layer 310 (e.g., a silicon oxide layer) has an etch selectivity with respect to the contact lines 430. As a result of the etching process applied to the exposed portions of the contact lines 430, contact patterns 435 may be formed on respective bit line contact regions 115 (see FIG. 8) and contact separation grooves 433 may be formed substantially between the contact patterns 435 disposed in each of the line-shaped contact grooves (see 330 of FIGS. 8 and 9). The contact patterns 435 may be generally located on respective bit line contact regions 115, thereby acting as bit line contacts that electrically connect the bit line contact regions 115 to bit lines formed in a subsequent process.

The contact patterns 435 may be formed by etching the contact lines 430 using the line-shaped contact separation mask patterns 450 generally intersecting the contact lines 430 as an etch mask. Thus, even though a pitch size of the contact patterns 435 may be reduced, the contact patterns 435 may be more readily formed minimizing pattern distortions or without any pattern distortions.

In the event that the contact patterns 435 are formed with a photo mask having island-shaped patterns generally corresponding to the contact patterns 435, generally island-shaped mask patterns instead of the line-shaped contact separation mask patterns 450 may be formed on the substrate. In this case, if spaces between the adjacent contact patterns 435 are reduced, the contact patterns 435 may be non-uniformly formed with pattern distortions. Thus, it may be difficult to directly transfer the island-shaped patterns of the photo mask onto the substrate without any pattern distortions using a single exposure technique of a lithography process.

To overcome the disadvantages of the single exposure technique, a double patterning technology (DPT) utilizing two separated photo masks may be used to form the contact patterns 435 with minimization of pattern distortions. Thus, the DPT may require two separated exposure steps and a careful alignment between two lithography processes performed using two separated photo masks, thereby increasing the fabrication cost and the process failure probability. However, according to the inventive concepts, the contact patterns 435 may be uniformly formed generally without pattern distortions using a single photo mask having a layout corresponding to the line-shaped contact separation mask patterns 450 that substantially intersect the contact lines 430, as described above. Consequently, the disadvantages of the double patterning technology (DPT) can be overcome.

Figure 12:
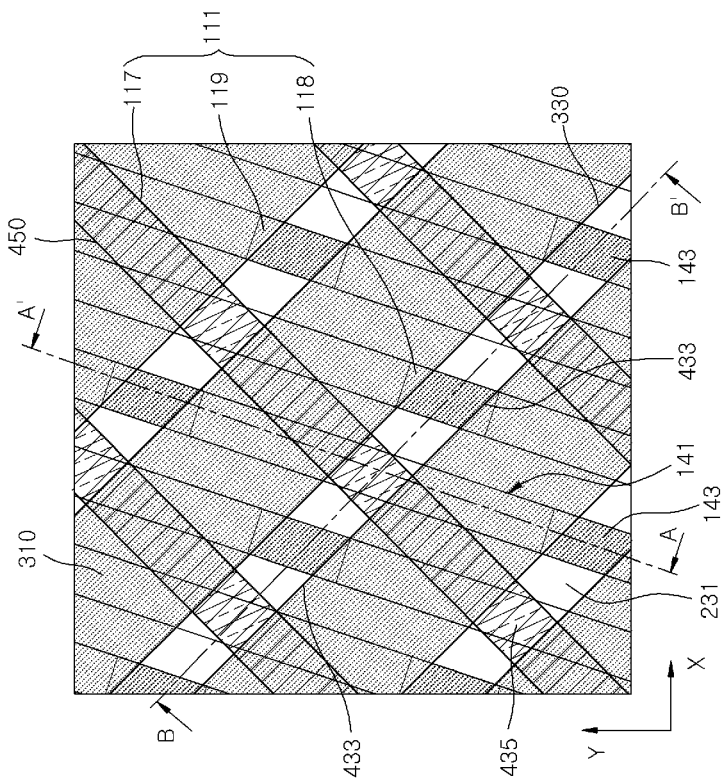
Figure 13:
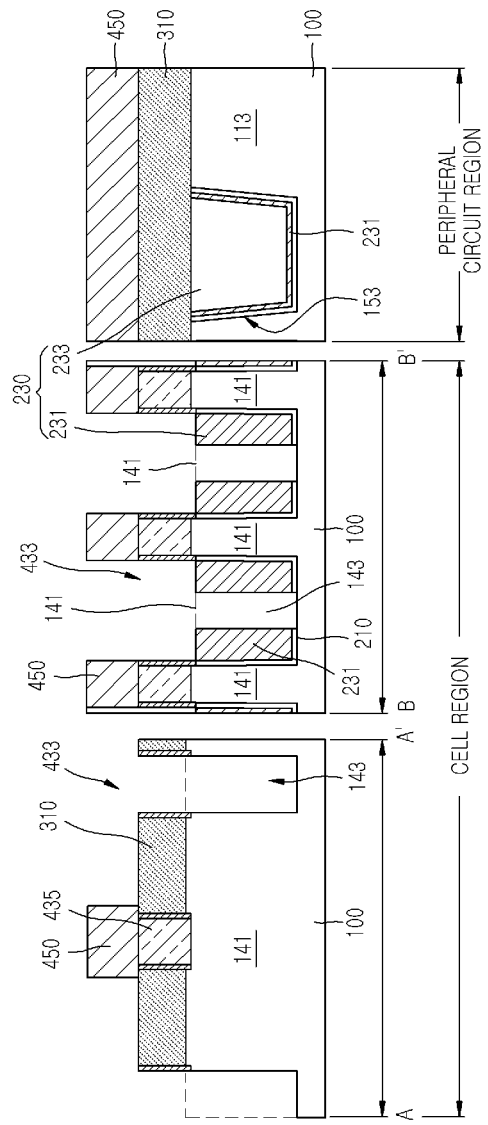

FIGS. 12 and 13 illustrate process steps of forming active separation grooves 143. FIG. 12 is a plan view illustrating an array layout of active separation grooves 143 in the cell region, and FIG. 13 is a merged cross-sectional view including a cell cross sectional view taken along lines A-A' and B-B' of FIG. 12 and a peripheral circuit cross sectional view.

Referring to FIGS. 12 and 13, the contact separation grooves 433 may generally expose portions of the semiconductor substrate 100 corresponding to the separation portions 118 or 119 of the cell active lines 111. The contact separation grooves 433 may correspond to regions which are defined and exposed by the line-shaped contact separation mask patterns 450 and the first interlayer insulation layer 310 when viewed from a plan view. The exposed portions of the semiconductor substrate 100 (e.g., the exposed separation portions 118 or 119) may be selectively etched to form active separation grooves 143 that substantially divide each of the cell active lines 111 into a plurality of cell active patterns 141 corresponding to the cell active region portions 117.

The active separation grooves 143 may be defined by the first interlayer insulation layer 310, the first isolation layer 231 exposed by the contact separation grooves 433, and line-shaped contact separation mask patterns 450 when viewed from a plan view. Thus, the active separation grooves 143 may be formed by selectively etching the exposed silicon substrate 100 using an etching recipe that exhibits an etch selectivity with respect to the first interlayer insulation layer 310, the first isolation layer 231 and the line-shaped contact separation mask patterns 450. For example, in the event that the first interlayer insulation layer 310 is generally formed of a silicon oxide layer and the first isolation layer 231 and the line-shaped contact separation mask patterns 450 are generally formed of a silicon nitride layer, the exposed silicon substrate 100 can be selectively etched using an etching recipe that exhibits an etch selectivity with respect to a silicon oxide layer and a silicon nitride layer.

The active separation grooves 143 may be formed to be generally self-aligned with the first interlayer insulation layer 310, the first isolation layer 231 and the line-shaped contact separation mask patterns 450. Thus, an additional cutting photo mask including hole-shaped opening patterns corresponding to the active separation grooves 143 may not be required to form the active separation grooves 143. Accordingly, the aforementioned exemplary embodiments may remove some disadvantages (e.g., pattern distortions or the like) occurred when the additional cutting photo mask including hole-shaped opening patterns is used to form the active separation grooves 143.

Figure 14:
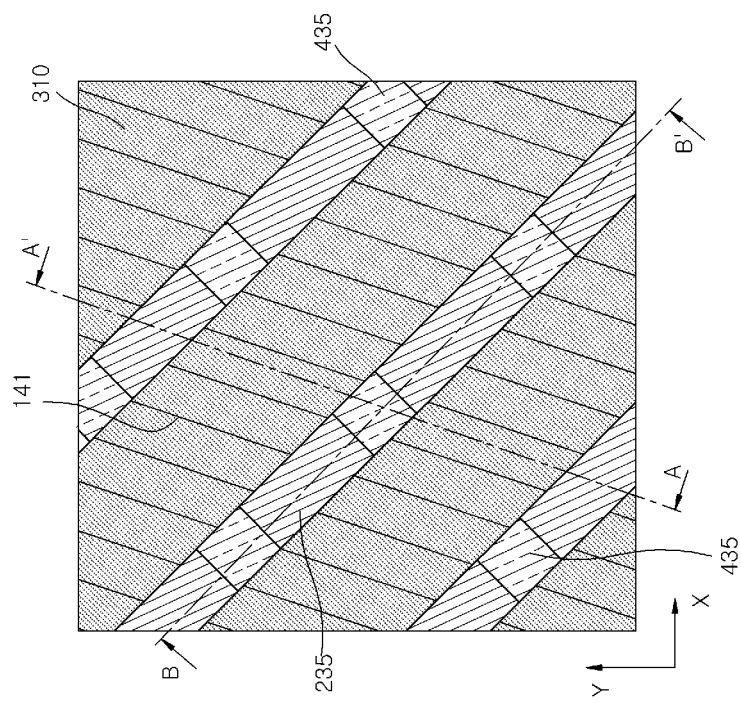
Figure 15:
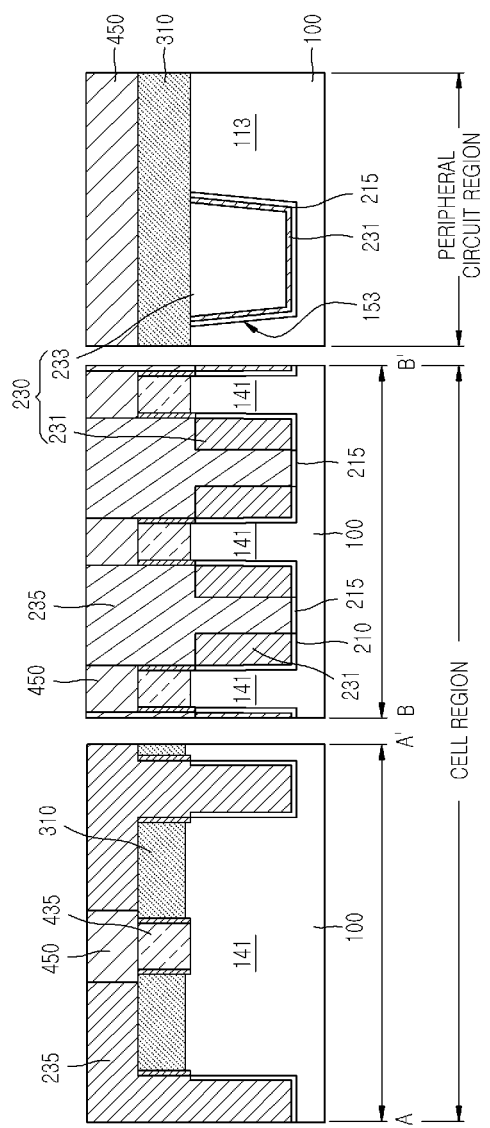

FIG. 14 is a plan view illustrating an array layout of third isolation layers 235 substantially filling the active separation grooves 143 (see FIG. 13) in the cell region, and FIG. 15 is a merged cross-sectional view including a cell cross sectional view taken along lines A-A' and B-B' of FIG. 14 and a peripheral circuit cross sectional view.

Referring to FIGS. 14 and 15, third isolation layers 235 may be formed to substantially fill the active separation grooves 143. Specifically, a separation groove liner 215, for example, an insulation layer may be conformed to cover the bottom surfaces and sidewalls of the active separation grooves 143. The separation groove liner 215 may be formed of the same material as the trench liner 210. For example, the separation groove liner 215 may be formed of a thermal oxide layer. Subsequently, an insulation layer may be formed on the substrate including the separation groove liner 215. The insulation layer may be then planarized until top surfaces of the line-shaped contact separation mask patterns 450 are substantially exposed, thereby forming third isolation layers 235 substantially within the active separation grooves 143 (see FIG. 13) and the contact separation grooves 433 (see FIG. 13). In an exemplary embodiment, the third isolation layers 235 may be formed of the same material as the first isolation layer 231.

Figure 16:
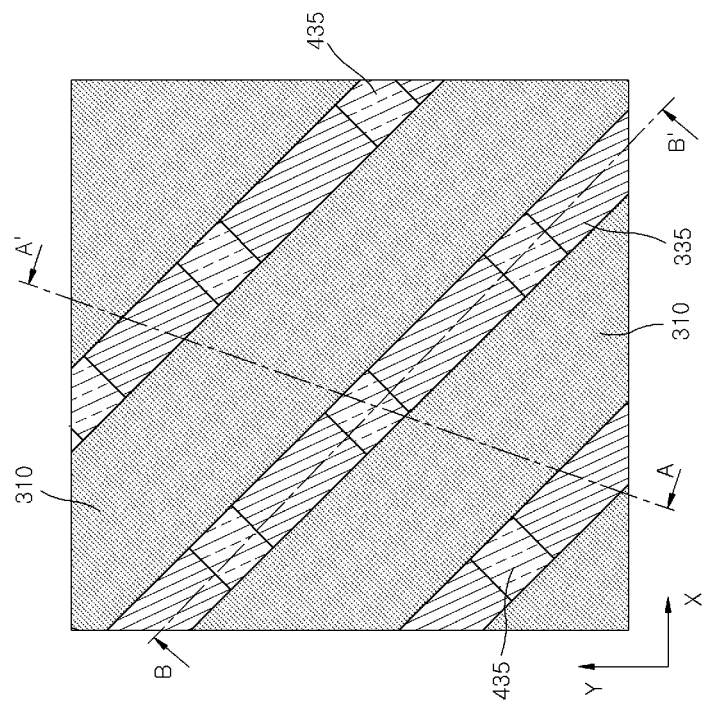
Figure 17:
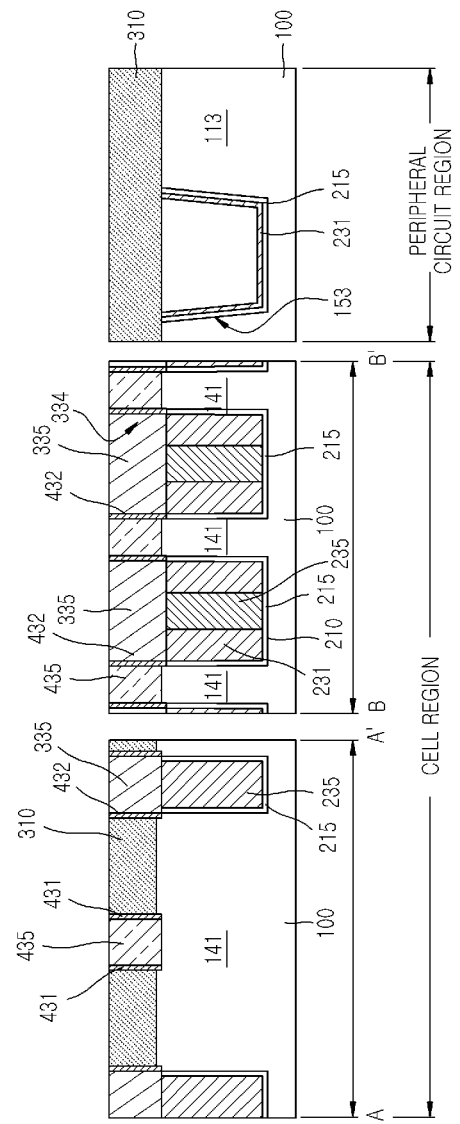

FIG. 16 is a plan view illustrating an array layout of recessed third isolation layers 235 in the cell region, and FIG. 17 is a merged cross-sectional view including a cell cross sectional view taken along lines A-A' and B-B' of FIG. 16 and a peripheral circuit cross sectional view.

Referring to FIGS. 16 and 17, the third isolation layers 235 may be recessed to reduce the burdens associated with the etching processes performed in subsequent processes. Additionally, the third isolation layers 235 and the line-shaped contact separation mask patterns 450 may be planarized until top surfaces of the contact patterns 435 and the first interlayer insulation layer 310 are substantially exposed, and the planarized third isolation layers 235 may be recessed such that top surfaces of the recessed third isolation layers 235 are substantially coplanar with top surfaces of the cell active patterns 141. As a result, recessed grooves 334 may be formed on the recessed third isolation layers 235. An insulation layer, for example, a silicon nitride layer may be conformed to and on the substrate including the recessed grooves 334, and the insulation layer may be anisotropically etched to substantially expose the top surface of the first interlayer insulation layer 310. As a result, second spacers 432 may be formed on the sidewalls of the contact patterns 435 and the sidewalls of the first interlayer insulation layer 310, which are exposed by the recessed grooves 334.

Subsequently, second interlayer insulation layers 335 may be formed to substantially fill the recessed grooves 334 that are generally surrounded by the second spacers 432. The second interlayer insulation layers 335 may be formed of substantially the same material as the first interlayer insulation layer 310. The second interlayer insulation layers 335 may be formed by depositing an insulation layer generally on the substrate including the second spacers 432 and by planarizing the insulation layer to substantially expose the top surfaces of the contact patterns 435 and the top surface of the first interlayer insulation layer 310.

Figure 18:
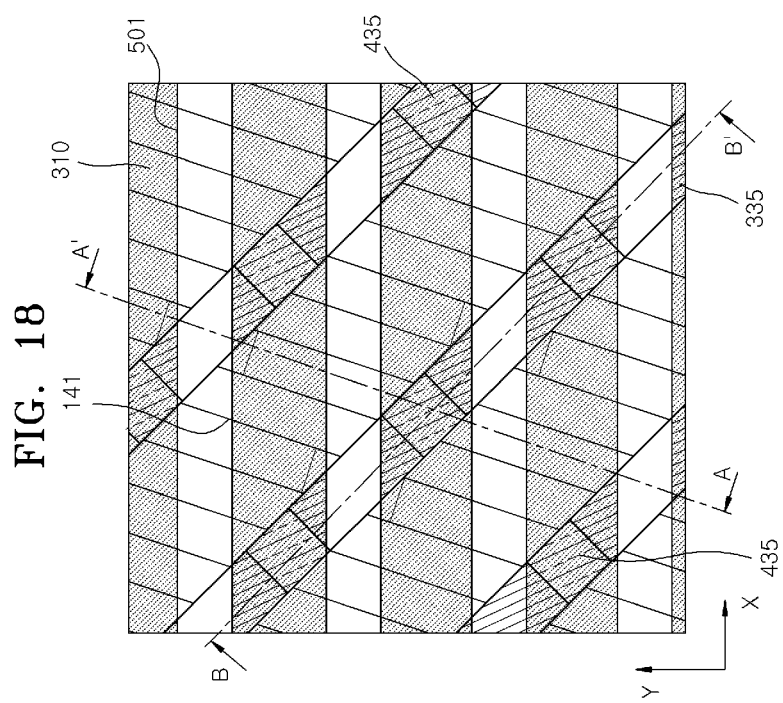
Figure 19:
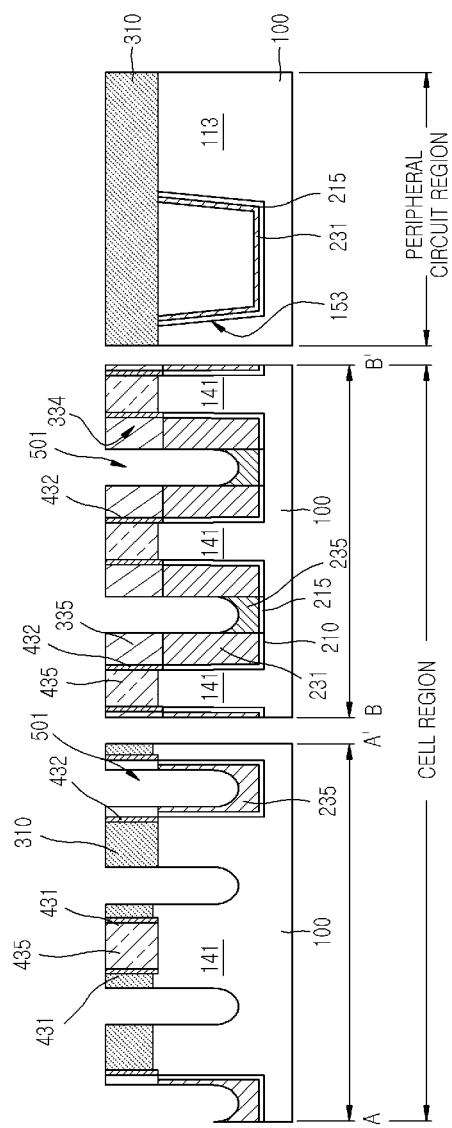

FIG. 18 is a plan view illustrating an array layout of buried gate grooves 501 in the cell region, and the FIG. 19 is a merged cross-sectional view including a cell cross sectional view taken along lines A-A' and B-B' of FIG. 18 and a peripheral circuit cross sectional view.

Referring to FIGS. 18 and 19, a plurality of buried gate grooves 501 may be formed to generally cross the cell active patterns 141. The buried gate grooves 501 may be formed by etching the first interlayer insulation layer 310, the second interlayer insulation layers 335, the recessed third isolation layers 235 and the cell active patterns 141. The buried gate grooves 501 may be formed to be parallel with an x-axis generally perpendicular to the y-axis in a plan view. In addition, each of the cell active patterns 141 may be divided into three regions by a pair of buried gate grooves 501 intersecting the same, and the contact patterns 435 may be disposed substantially between the buried gate grooves 501. Thus, the buried gate grooves 501 may not overlap with contact patterns 435 when viewed from a plan view.

Figure 20:
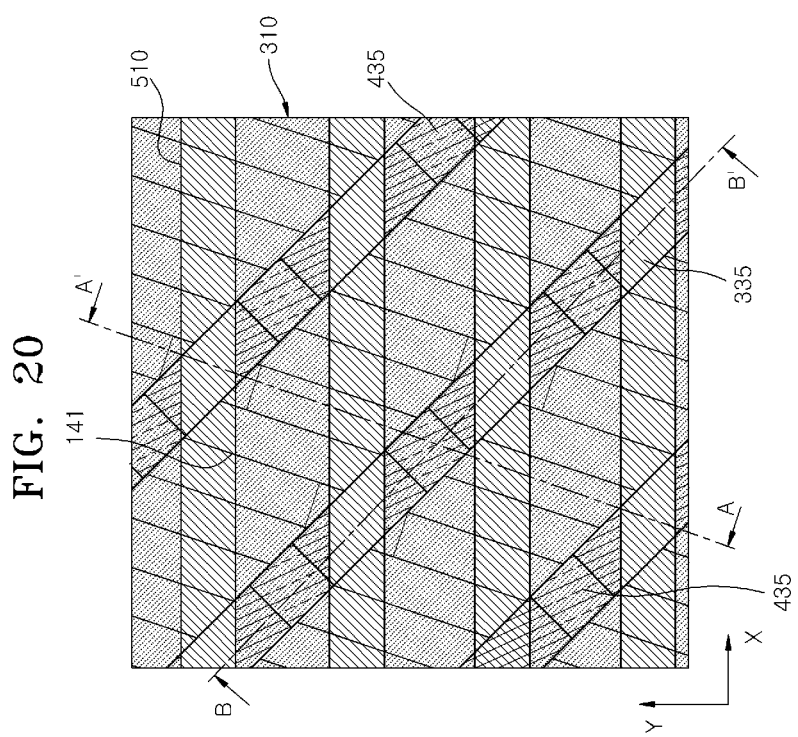
Figure 21:
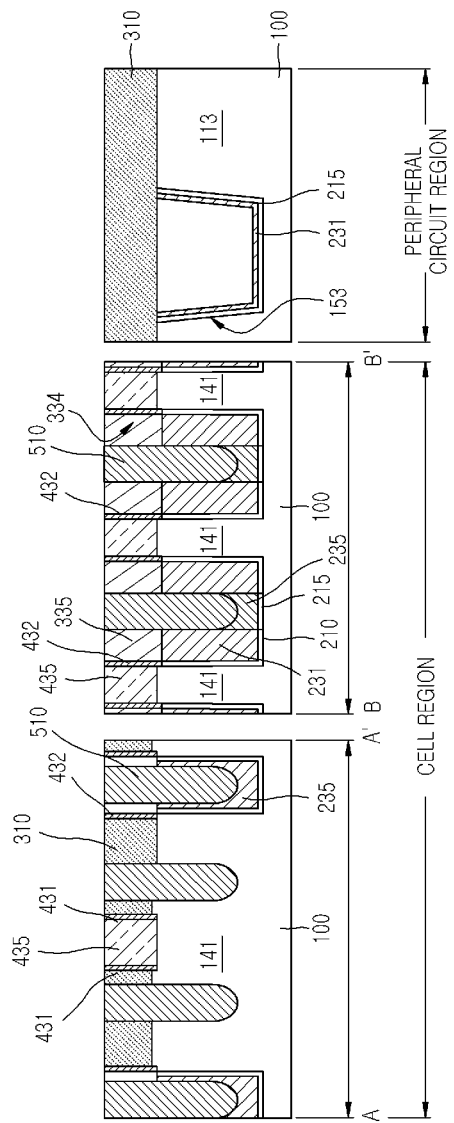

FIG. 20 is a plan view illustrating an array layout of buried gate layers 510 in the cell region, and FIG. 21 is a merged cross-sectional view including a cell cross sectional view taken along lines A-A' and B-B' of FIG. 20 and a peripheral circuit cross sectional view.

Referring to FIGS. 20 and 21, a gate dielectric layer may be formed generally on inner surfaces of the buried gate grooves 501, and a gate conductive layer may be formed generally on the substrate including the gate dielectric layer. The gate conductive layer may be formed to include a metal layer, for example, a titanium nitride (TiN) layer or a tungsten (W) layer etc. The gate conductive layer may be formed to substantially fill the buried gate grooves 501. The gate conductive layer may then be planarized until the top surfaces of the contact patterns 435 are substantially exposed, thereby forming buried gates 510 in respective buried gate grooves 501.

Figure 22:
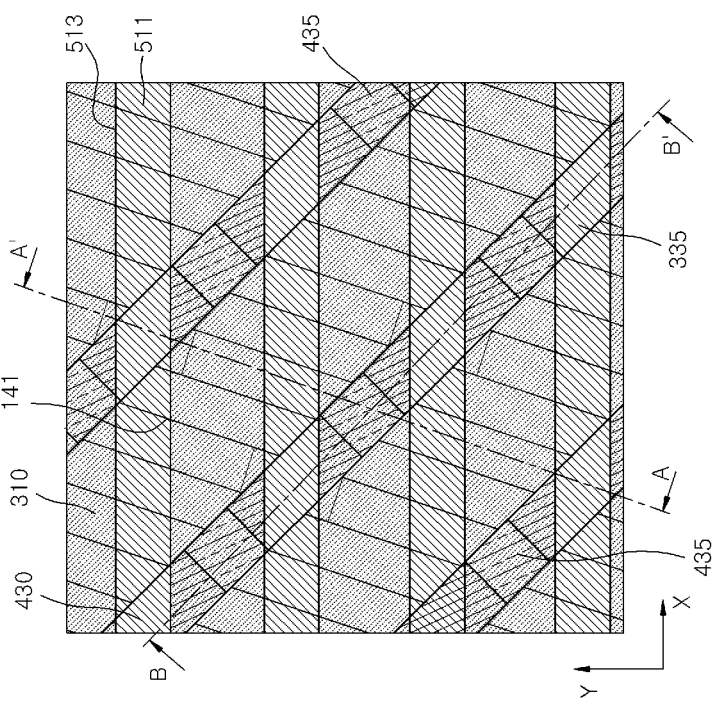
Figure 23:
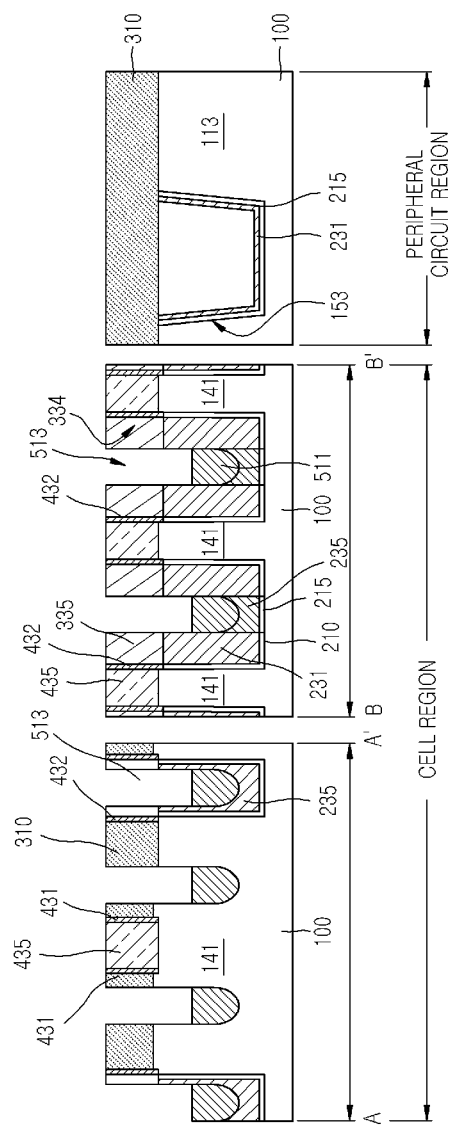

FIG. 22 is a plan view illustrating an array layout of recessed buried gates 511 in the cell region, and FIG. 23 is a merged cross-sectional view including a cell cross sectional view taken along lines A-A' and B-B' of FIG. 22 and a peripheral circuit cross sectional view.

Referring to FIGS. 22 and 23, the buried gates 510 (see FIG. 21) may be selectively etched to recess the buried gates 510 and to form sealing grooves 513 substantially on the recessed buried gates 511. Thus, top surfaces of the recessed buried gates 511 may be located at a lower level than top surfaces of the cell active patterns 141.

Figure 24:
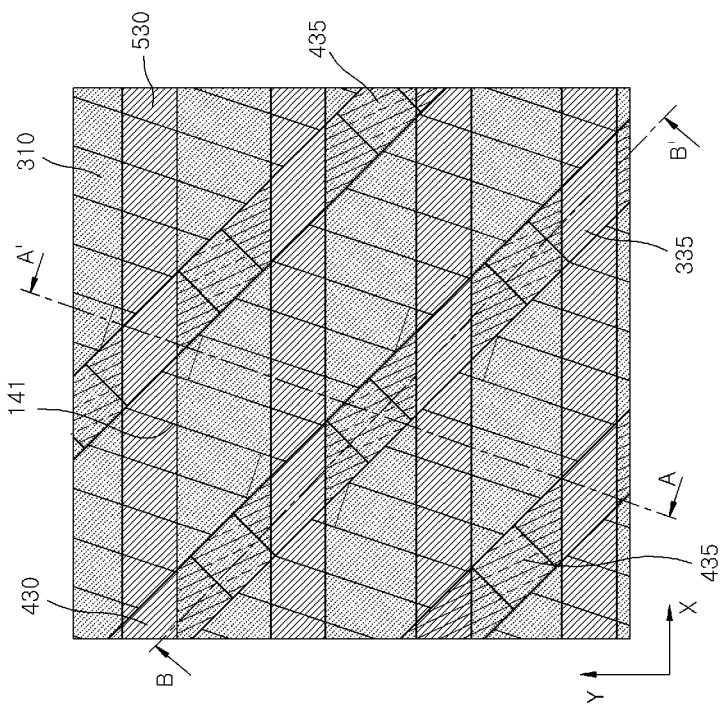
Figure 25:
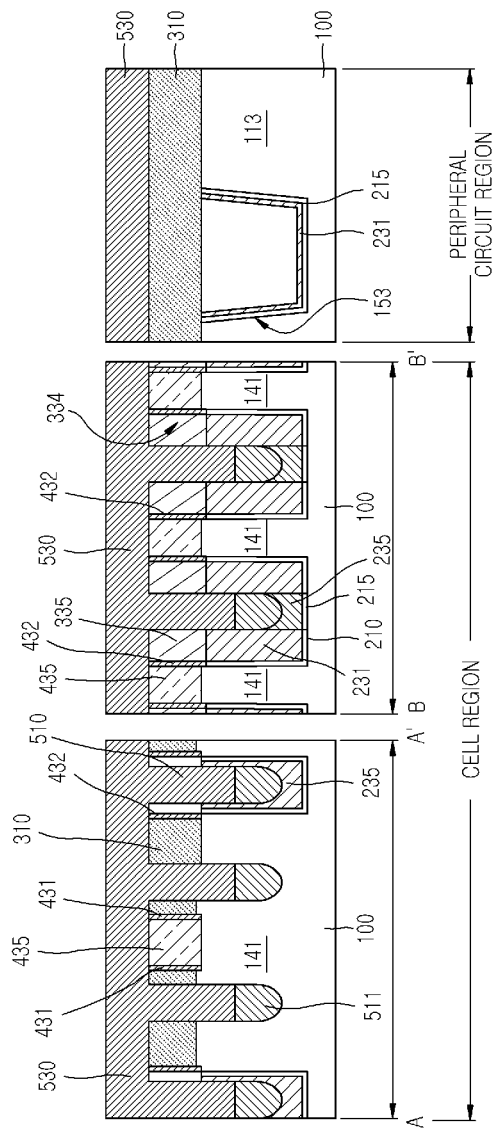

FIG. 24 is a plan view illustrating an array layout of sealing layers 530 on the recessed buried gates 511 (see FIG. 23) in the cell region, and FIG. 25 is a merged cross-sectional view including a cell cross sectional view taken along lines A-A' and B-B' of FIG. 24 and a peripheral circuit cross sectional view.

Referring to FIGS. 24 and 25, a sealing layer 530 may be deposited on the substrate including the sealing grooves 513 (see FIG. 23). The sealing layer 530 may be formed to substantially fill the sealing grooves 513. The sealing layer 530 may be formed of an insulation material having an etch selectivity with respect to the first and second interlayer insulation layers 310 and 335 to substantially protect the recessed buried gates 511 when a subsequent etching process is performed. For example, when the first and second interlayer insulation layers 310 and 335 are formed of a silicon oxide layer, the sealing layer 530 may be formed to include a silicon nitride layer.

Figure 26:
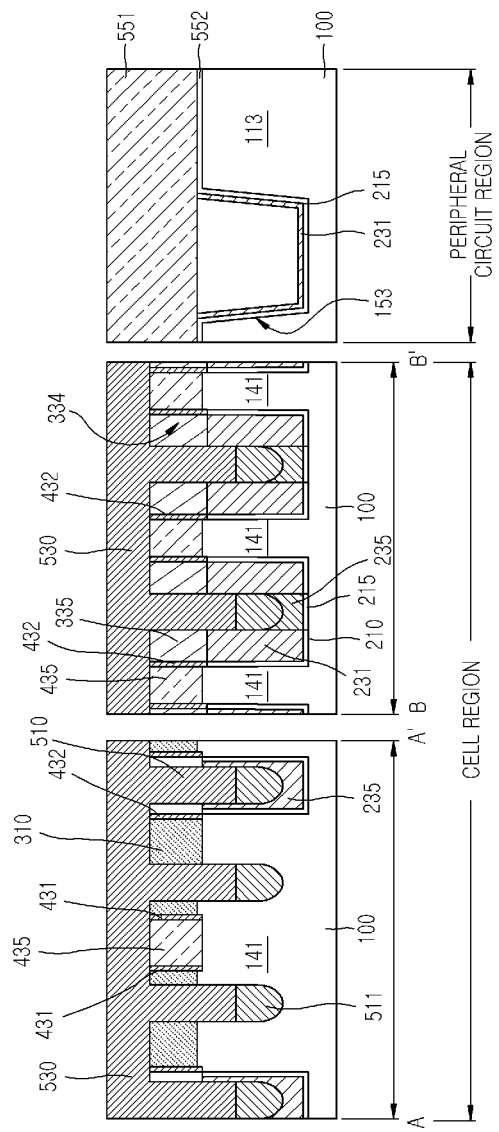

FIG. 26 is a merged cross-sectional view illustrating process steps of forming a first peripheral gate layer 551.

Referring to FIG. 26, the sealing layer 530 and the first interlayer insulation layer 310 in the peripheral circuit region may be selectively removed to substantially expose top surfaces of the peripheral active regions 113. Specifically, a peripheral open mask pattern (not shown) may be formed generally on the sealing layer 530. The peripheral open mask pattern may be formed to substantially cover the sealing layer 530 in the cell region and to substantially expose the sealing layer 530 in the peripheral circuit region. The sealing layer 530 and the first interlayer insulation layer 310 in the peripheral circuit region may be selectively etched using the peripheral open mask pattern as an etch mask, thereby substantially exposing the top surfaces of the peripheral active regions 113. After the peripheral open mask pattern is removed, a peripheral gate dielectric layer 552 may be formed generally on the exposed top surfaces of the peripheral active regions 113. The peripheral gate dielectric layer 552 may be formed of a dielectric layer such as a silicon oxide layer etc.

Subsequently, a conductive layer may be formed substantially on the substrate including the peripheral gate dielectric layer 552, and the conductive layer may be planarized to substantially expose a top surface of the sealing layer 530 in the cell region. As a result, a first peripheral gate layer 551 may be formed substantially on the peripheral gate dielectric layer 552.

Figure 27:
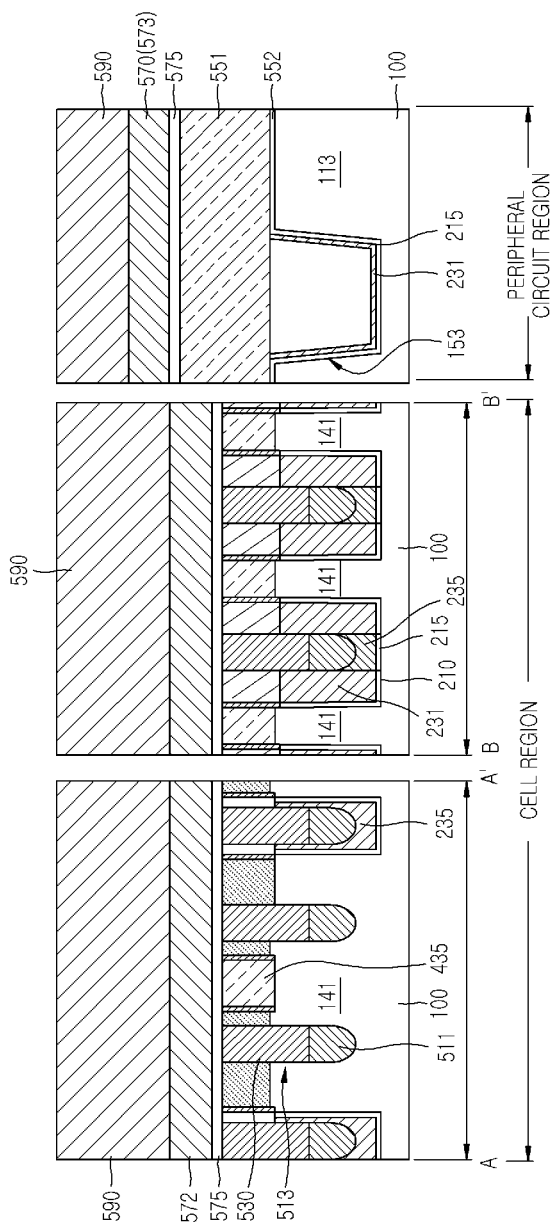

FIG. 27 is a merged cross-sectional view illustrating process steps of forming a bit line layer 570.

Referring to FIG. 27, the sealing layer 530 remaining in the cell region may be planarized to expose top surfaces of the contact patterns 435, the first interlayer insulation layer 310 and the second interlayer insulation layers 335 (see FIG. 26). That is, the sealing layer 530 may be etched back to leave sealing patterns 530 on respective recessed buried gates 511. A bit line layer 570 may be formed substantially on the substrate including the sealing patterns 530. The bit line layer 570 may be formed to include a conductive layer having a higher conductivity than a doped polysilicon layer. For example, the bit line layer 570 may be formed to include a metal layer such as a tungsten (W) layer, etc. In an exemplary embodiment, a first barrier metal layer 575, for example, a titanium nitride (TiN) layer may be formed substantially on the substrate including the sealing patterns 530 before the bit line layer 570 is formed.

The bit line layer 570 and the first barrier metal layer 575 may be formed to extend generally onto the peripheral circuit region. That is, the bit line layer 570 and the first barrier metal layer 575 may be formed to substantially cover the first peripheral gate layer 551 in the peripheral circuit region. The bit line layer 570 in the cell region (e.g., a first bit line layer 571) may be patterned in a subsequent process to form bit lines that control operation of memory cells of the DRAM device, and the bit line layer 570 in the peripheral circuit region (e.g., a second bit line layer 573) may be patterned in a subsequent process to form a second peripheral gate layer having a higher conductivity than the first peripheral gate layer 551. A bit line capping layer 590 may be then formed substantially on the bit line layer 570. The bit line capping layer 590 may be used as a hard mask layer protecting the bit line layer 570. The bit line capping layer 590 may be formed to include a silicon nitride layer.

Figure 28:
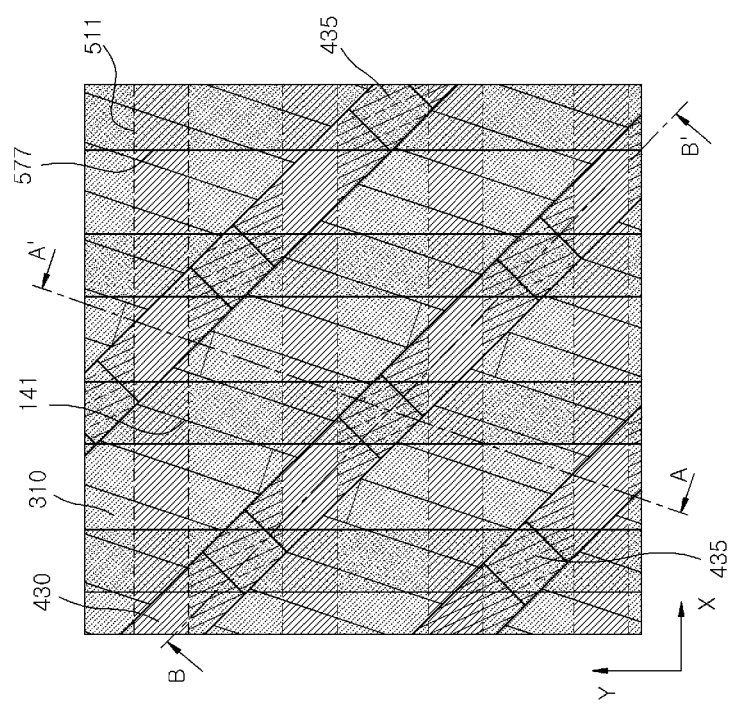
Figure 29:
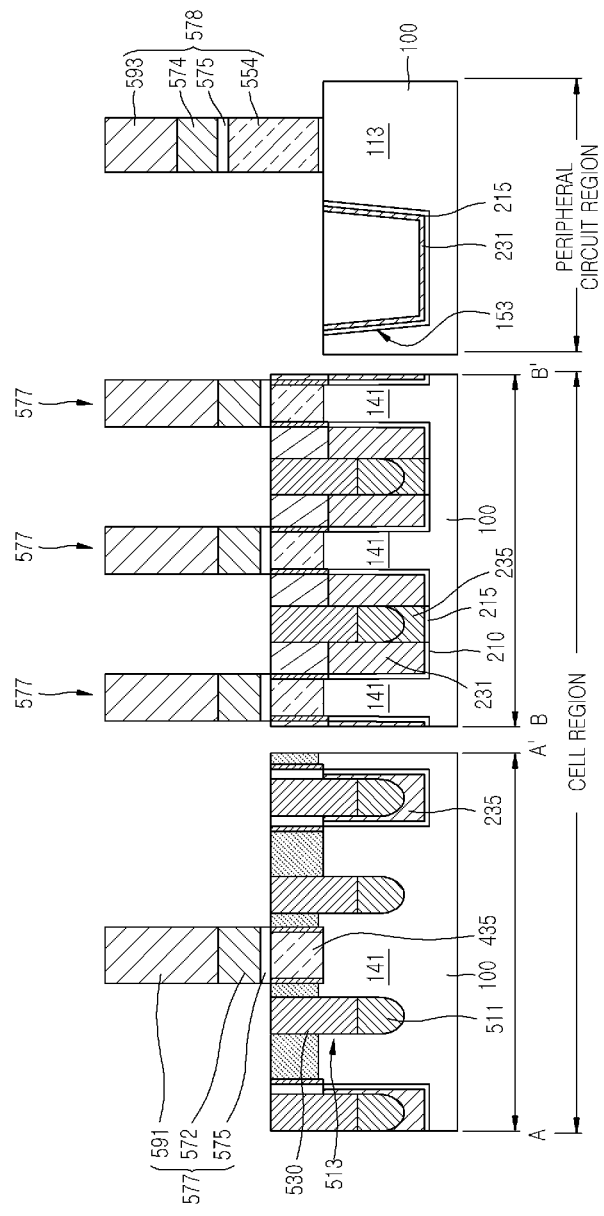

FIG. 28 is a plan view illustrating an array layout of bit line stacks 577 in the cell region, and FIG. 29 is a merged cross-sectional view including a cell cross sectional view taken along lines A-A' and B-B' of FIG. 28 and a peripheral circuit cross sectional view.

Referring to FIGS. 28 and 29, an array layout corresponding to bit line stacks 577 may be generated to extend generally along the y-axis direction intersecting the recessed buried gates 511 and to substantially overlap with the contact patterns 435, as illustrated in FIG. 28. The array layout corresponding to the bit line stacks 577 may be transferred on the substrate using a lithography process, thereby forming a bit line mask pattern (not shown) on the bit line capping layer 590. The bit line mask pattern may be formed to include a plurality of line patterns (corresponding to the bit line stacks 577) in the cell region and to substantially cover an entire portion of the peripheral circuit region. The bit line capping layer 590, the bit line layer 570 and the first barrier metal layer 575 may be etched using the bit line mask pattern as an etch mask, thereby forming the bit line stacks 577. Each of the bit line stacks 577 may be formed to include a first barrier metal pattern 575, a bit line 572, and a bit line capping pattern 591 which may be sequentially stacked. The bit lines 572 may be formed to substantially overlap with the contact patterns 435, as illustrated in FIG. 28. Thus, the bit lines 572 may be electrically connected to the contact patterns 435. That is, the contact patterns 435 may act as bit line contacts.

After the bit line stacks 577 are formed, the bit line mask pattern may be removed. A peripheral gate mask pattern (not shown) may be then formed substantially on the substrate where the bit line mask pattern is removed. The peripheral gate mask pattern may be formed to substantially cover the cell region and to include a peripheral gate pattern in the peripheral circuit region. The bit line capping layer 590, the bit line layer 570, the first barrier metal layer 575, and the first peripheral gate layer 551 may be etched using the peripheral gate mask pattern as an etch mask, thereby forming at least one peripheral gate stack 578 in the peripheral circuit region. Accordingly, the peripheral gate stack 578 may be formed to include a first peripheral gate 554, a first barrier metal pattern 575, a second peripheral gate 574, and a peripheral gate capping pattern 593 which may be sequentially stacked.

As described above, the bit line stacks 577 and the peripheral gate stack 578 may be independently formed using two separated patterning processes. However, the inventive concept may not be limited thereto. For example, the bit line stacks 577 and the peripheral gate stack 578 may be simultaneously formed or formed at generally the same time using a single patterning process that may include a single exposure process and a single etching process if a process margin of the single patterning process is within an allowable range.

Figure 30:
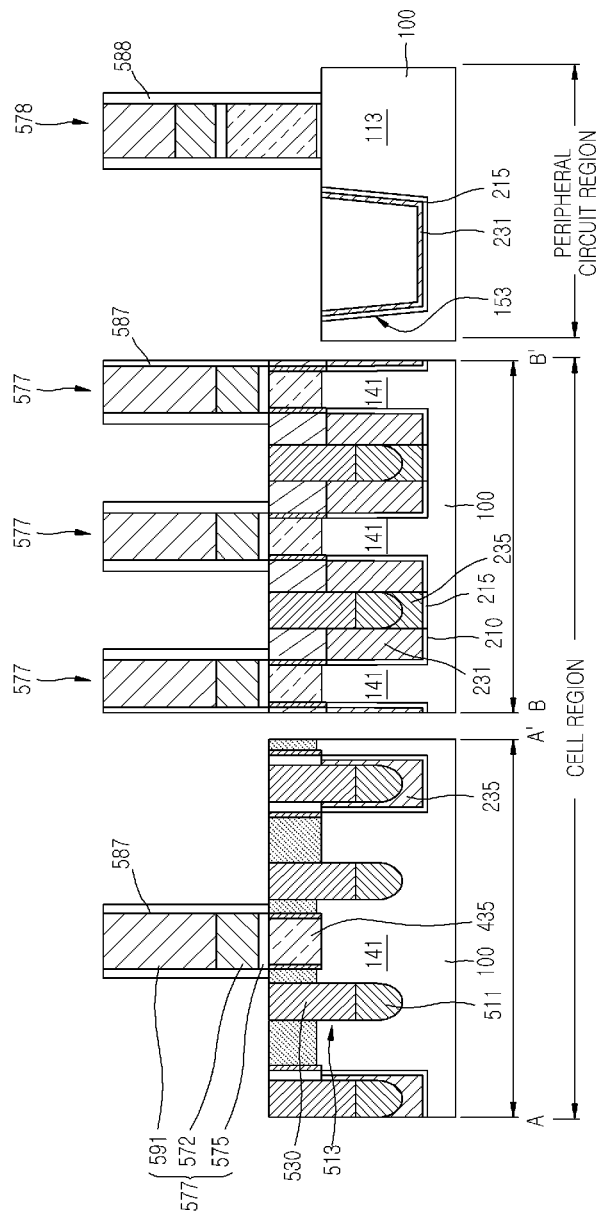

FIG. 30 is a merged cross-sectional view illustrating process steps of forming bit line spacers 587.

Referring to FIG. 30, a bit line spacer layer may be conformed to and on the substrate including the bit line stacks 577 and the peripheral gate stack 578. The bit line spacer layer may be then anisotropically etched to form bit line spacers 587 substantially covering the sidewalls of the bit line stacks 577, and peripheral gate spacers 588 substantially covering the sidewalls of the peripheral gate stack 578. The bit line spacers 587 and the peripheral gate spacers 588 may be formed of an insulation material. For example, the bit line spacers 587 and the peripheral gate spacers 588 may be formed of a silicon nitride layer having an etch selectivity with respect to a silicon oxide layer.

Figure 31:
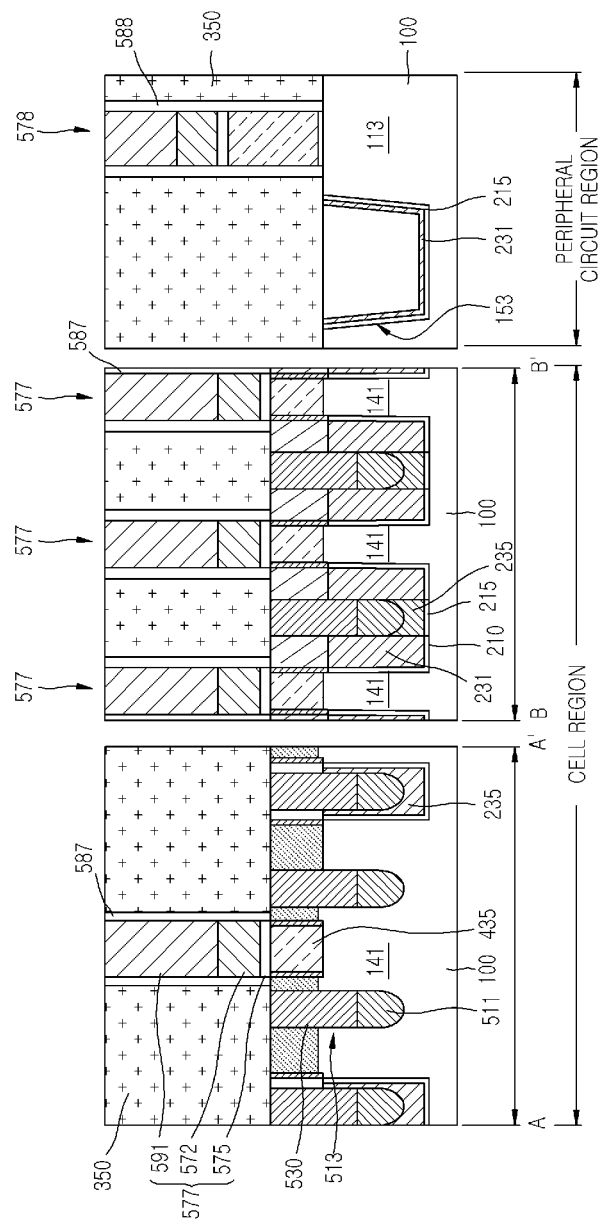

FIG. 31 is a merged cross-sectional view illustrating process steps of forming a third interlayer insulation layer 350.

Referring to FIG. 31, a third interlayer insulation layer 350 may be formed to substantially fill spaces generally between the bit line stacks 577 as well as substantially between the peripheral gate stacks 578. Specifically, an insulation layer, for example, a silicon oxide layer may be formed substantially on the substrate including the bit line spacers 587 and the peripheral gate spacers 588. Subsequently, the insulation layer may be planarized until top surfaces of the bit line stacks 577 and the peripheral gate stacks 578 are substantially exposed, thereby forming the third interlayer insulation layer 350.

Figure 32:
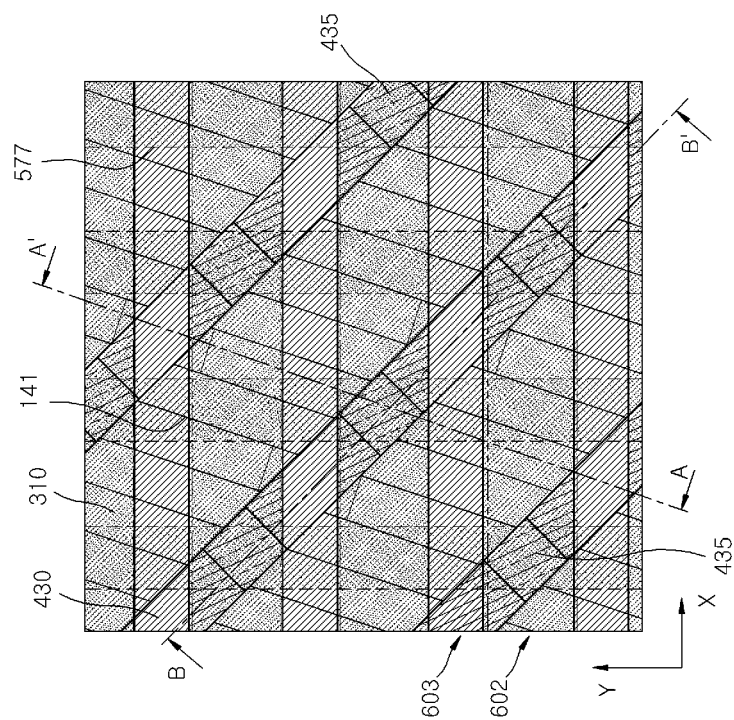
Figure 33:
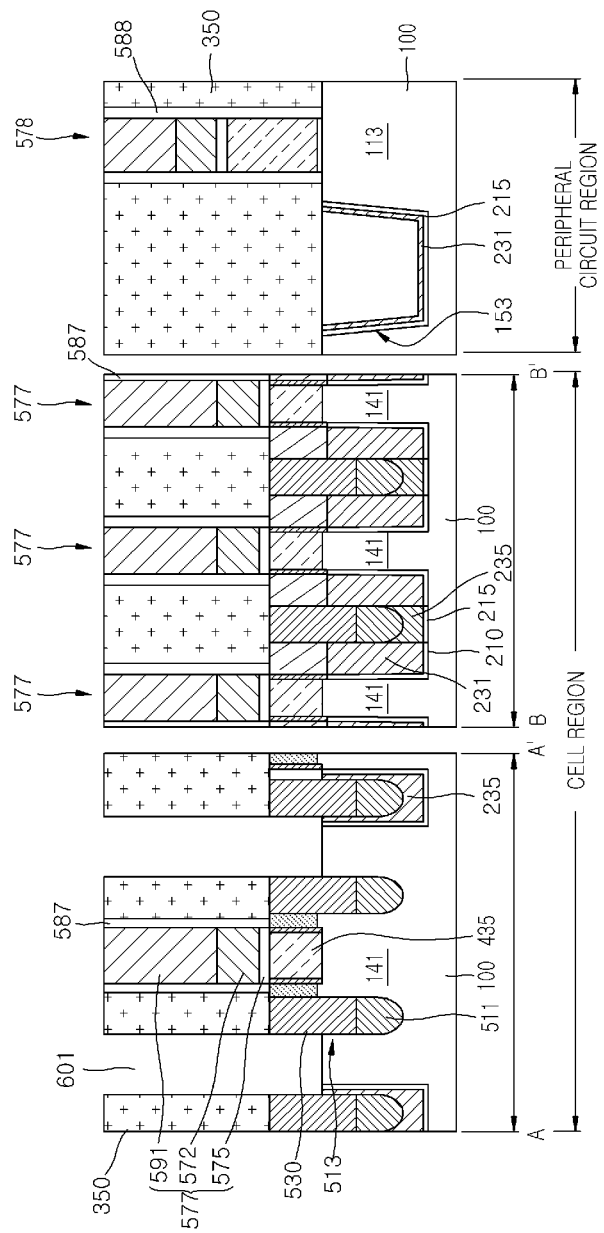

FIG. 32 is a plan view illustrating a layout of a storage node contact mask pattern for forming storage node contact holes 601 in the cell region, and FIG. 33 is a merged cross-sectional view including a cell cross sectional view taken along lines A-A' and B-B' of FIG. 32 and a peripheral circuit cross sectional view.

Referring to FIGS. 32 and 33, the third interlayer insulation layer 350 and the first interlayer insulation layer 310 may be patterned to from storage node contact holes 601 that substantially expose both ends of each of the cell active patterns 141. The storage node contact holes 601 may be formed by etching the third interlayer insulation layer 350 and the first interlayer insulation layer 310 using a storage node contact mask pattern (not shown) as an etch mask. The storage node contact holes 601 may be formed to generally be self-aligned with the bit line stacks 577.

The storage node contact mask pattern may be formed on the substrate including the third interlayer insulation layer 350. The storage node contact mask pattern may be formed using a photo mask (not shown) that includes a layout pattern corresponding to line patterns 603 defining line-shaped grooves 602 that generally intersect the bit line stacks 577. That is, the storage node contact mask pattern may be formed to include the line patterns 603 defining the line-shaped grooves 602 that are generally parallel with the x-axis. The third interlayer insulation layer 350 and the first interlayer insulation layer 310 may be etched using the storage node contact mask pattern as an etch mask, thereby forming the storage node contact holes 601. While the storage node contact holes 601 are formed, the bit line stacks 577 and the bit line spacers 587 exposed by the line-shaped grooves 602 may not be substantially etched because the bit line capping patterns 591 and the bit line spacers 587 are formed of an insulation material (e.g., a silicon nitride layer) having an etch selectivity with respect to the interlayer insulation layers 350 and 310 (e.g., silicon oxide layers). Thus, the storage node contact holes 601 may be formed to substantially be self-aligned with the bit line stacks 577 and the bit line spacers 587.

Figure 34:
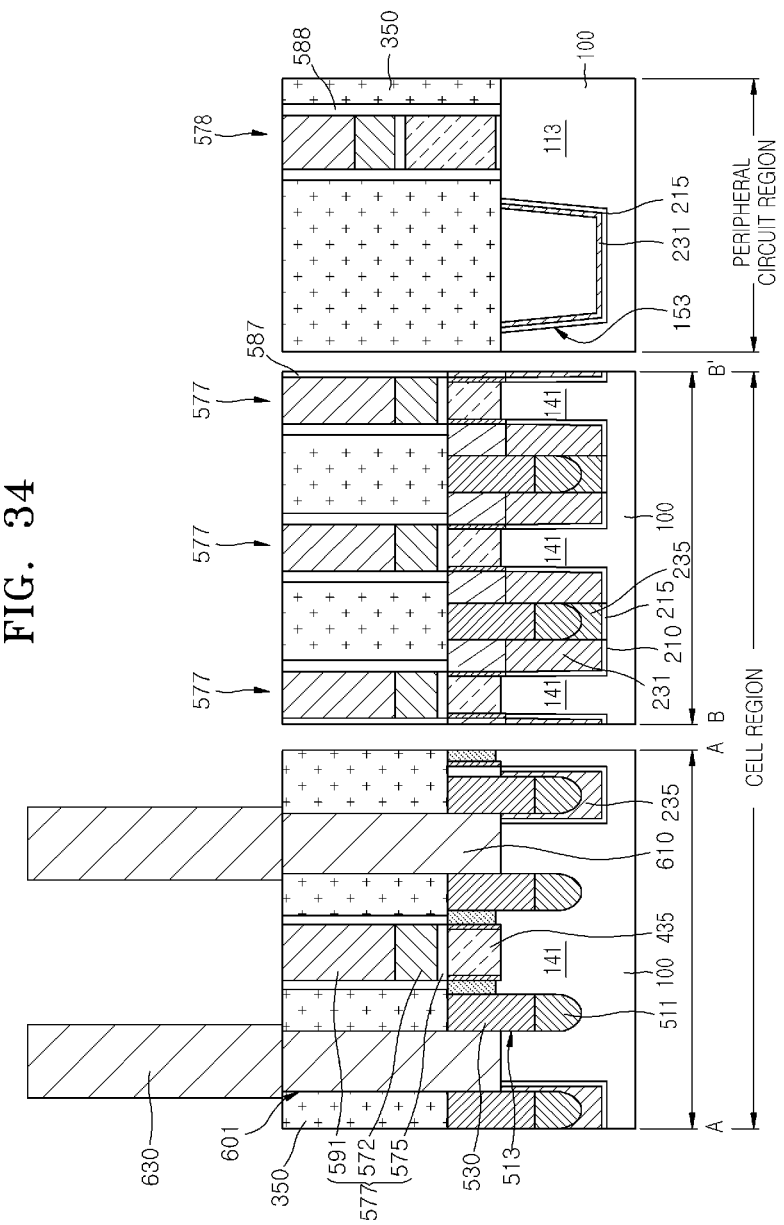

FIG. 34 is a merged cross-sectional view illustrating process steps of forming storage node contacts 610 and storage nodes 630 in the cell region.

Referring to FIG. 34, a conductive layer may be formed to substantially fill the storage node contact holes 601, and the conductive layer may be planarized to substantially expose top surfaces of the third interlayer insulation layer 350. As a result, storage node contacts 610 may be formed in respective storage node contact holes 601. The storage node contacts 610 may be formed to include a doped polysilicon layer. Subsequently, storage nodes 630 may be formed on respective storage node contacts 610. Each of the storage nodes 630 may be formed to generally have a pillar shape or a cylindrical shape. In some exemplary embodiments, the storage nodes 630 may be formed of a metal layer such as a titanium nitride (TiN) layer, etc. A dielectric layer (not shown) and a plate node (not shown) may be sequentially stacked substantially on the storage nodes 630 to form cell capacitors.

Figure 35:
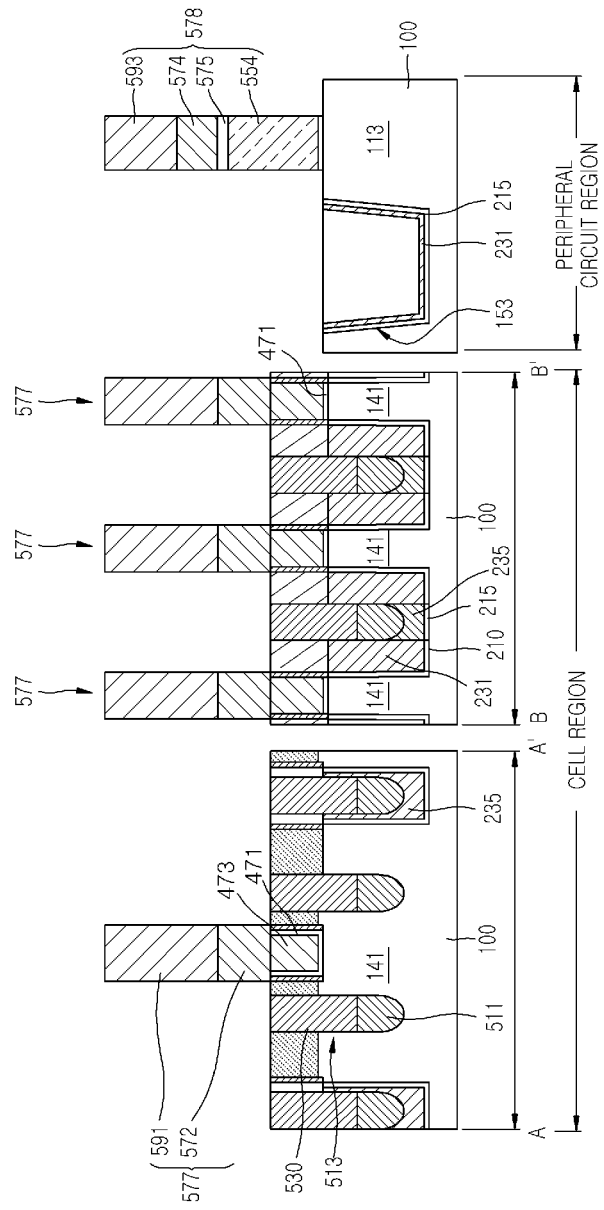
FIG. 35 illustrates an example of a method of fabricating a semiconductor device including fine patterns according to another embodiment.

FIG. 35 illustrates an example of a method of fabricating a semiconductor device including fine patterns according to another embodiment. The present embodiment is similar to the previous embodiment described with reference to FIGS. 1 to 34. Thus, to avoid duplicate explanation, differences between the present embodiment and the previous embodiment illustrated in FIGS. 1 to 34 will mainly be described in detail hereinafter.

Referring to FIG. 35, the contact patterns 435 illustrated in FIG. 34 may be formed of a doped polysilicon layer, contact patterns 473 of the present exemplary embodiment may be formed to include a metal layer such as a tungsten (W) layer, etc. In the event that the contact patterns 473 are formed of a metal layer, a second barrier metal layer 471 such as a titanium nitride (TiN) layer may be introduced substantially between the cell active patterns 141 (e.g., portions of the silicon substrate 100) and the contact patterns 473 (e.g., metal contact patterns). The metal contact patterns 473 may have a relatively higher conductivity than the polysilicon contact patterns 435. Thus, the metal contact patterns 473 of the present exemplary embodiment may reduce the contact resistance between the bit lines 572 and the cell active patterns 141, thereby improving the operation speed of the semiconductor device (e.g., a DRAM device).

FIGS. 36 to 58 illustrate a method of fabricating a semiconductor device including fine patterns according to still another embodiment.

Figure 58:
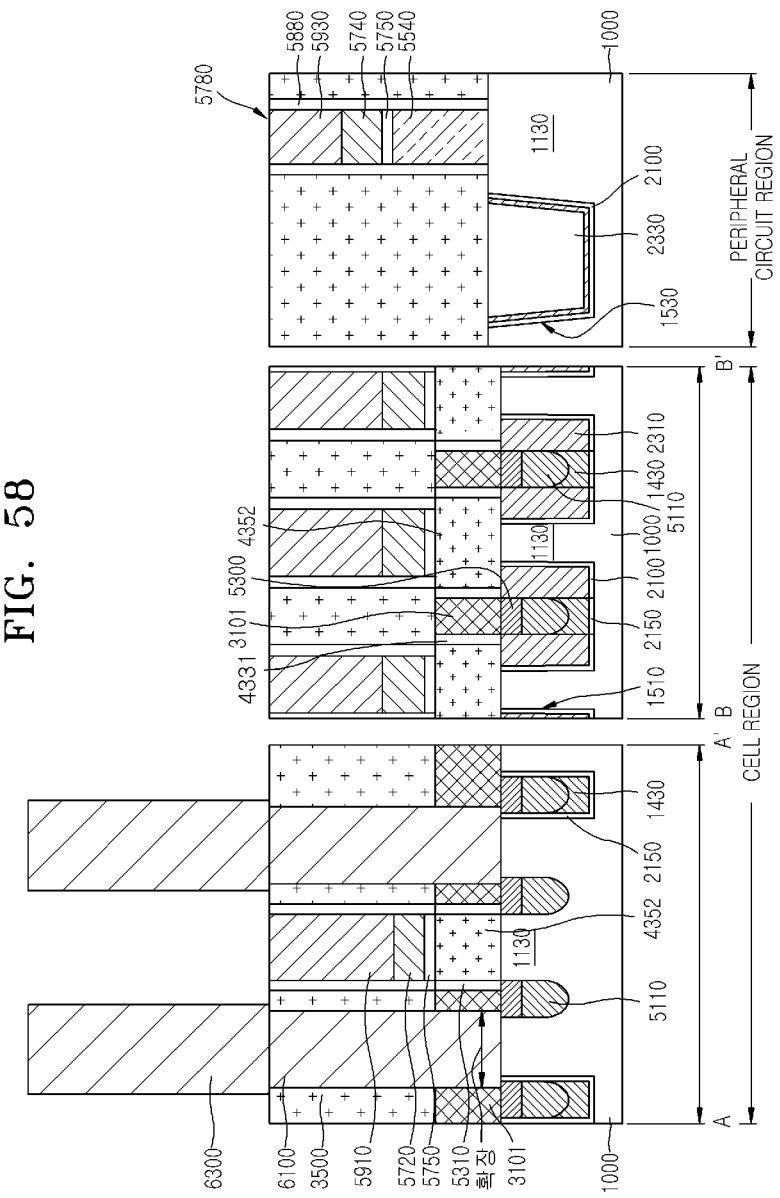

According to the previous embodiments illustrated in FIGS. 1 to 35, the bit line contact patterns 435 or 473 may be formed before the recessed buried gates 511 are formed. In contrast, according to the present embodiment, recessed buried gates may be formed before bit line contact patterns are formed. This may lead to the improvement of the profile of the buried gate grooves (corresponding to the elements indicated by numerals "501" of FIG. 18) and to the improvement of the uniformity of the buried gates (corresponding to the elements indicated by numerals "510" of FIGS. 20 and 21). In FIGS. 1 to 58, the same reference numerals or the same reference designators denote the same elements or substantially equal elements from one figure to the next.

Figure 36:
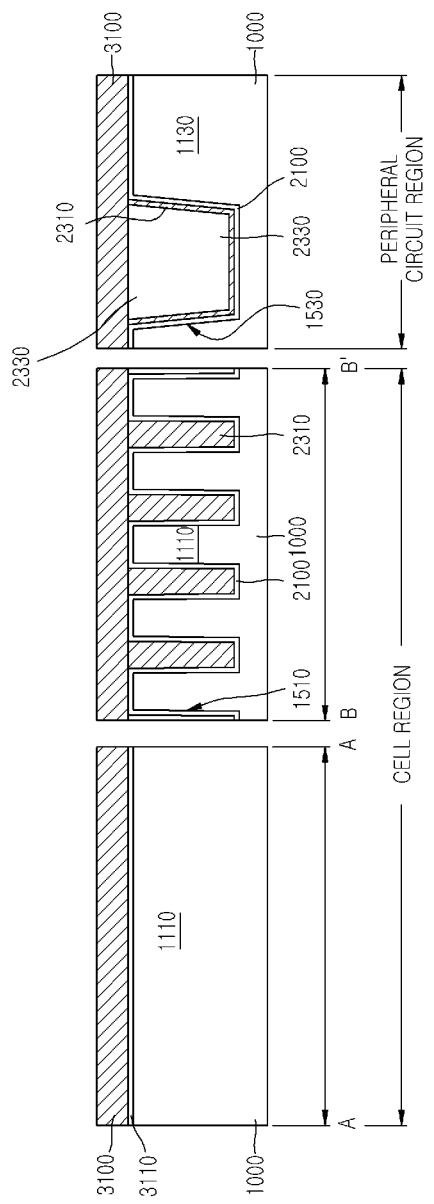
FIGS. 36 to 58 illustrate an example of a method of fabricating a semiconductor device including fine patterns according to still another embodiment.

FIG. 36 is a merged cross-sectional view illustrating process steps of forming a third interlayer insulation layer 3100 substantially covering first and second isolation layers 2310 and 2330.

Referring to FIG. 36, first trenches 1510 and second trench 1530 may be formed in a semiconductor substrate 1000 using the same manners as described with reference to FIGS. 1 to 5. The first trenches 1510 and second trench 1530 may be formed in a cell region and a peripheral circuit region, respectively. The first trenches 1510 may define cell active lines 1110 in the cell region and the second trench 1530 may define peripheral active regions 1130 in the peripheral circuit region. Subsequently, a first isolation layer 2310 may be formed to substantially fill the first trenches 1510 and to generally conform to and cover the bottom surface and sidewalls of the second trench 1530, and a second isolation layer 2330 may be formed substantially on the first isolation layer 2310 to substantially fill the second trench 1530 substantially surrounded by the first isolation layer 2310.

A third interlayer insulation layer 3100 may be formed substantially on the substrate including the first isolation layer 2310 and the second isolation layer 2330. That is, the substrate including the first isolation layer 2310 and the second isolation layer 2330 may be substantially covered with the third interlayer insulation layer 3100 instead of the first interlayer insulation layer 310 described with reference to FIG. 7. The third interlayer insulation layer 3100 may be formed to include a silicon nitride layer. A pad oxide layer 3110 may be formed substantially between the third interlayer insulation layer 3100 and the semiconductor substrate 1000. The pad oxide layer 3110 may be formed to improve an interface characteristic (e.g., an adhesive property) between the third interlayer insulation layer 3100 and the semiconductor substrate 1000. The material of the third interlayer insulation layer 3100 may not be limited to a silicon nitride layer. For example, the third interlayer insulation layer 3100 may be formed of any other insulation layer having an etch selectivity with respect to a silicon oxide layer.

The third interlayer insulation layer 3100 may function as a molding layer in which bit line contacts may be formed in a subsequent process. Further, the third interlayer insulation layer 3100 may be used as a sacrificial insulation layer. Accordingly, a thickness of the third interlayer insulation layer 3100 may be determined in consideration with a height of the bit line contacts. For example, the third interlayer insulation layer 3100 may be formed to have a thickness which is substantially equal to the height of the bit line contacts.

Figure 37:
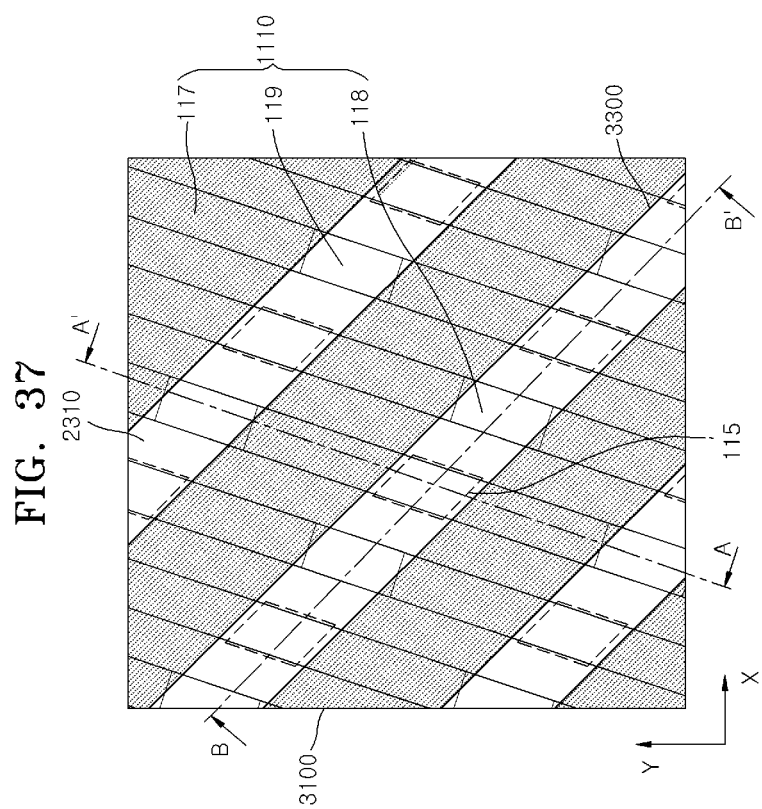
Figure 38:
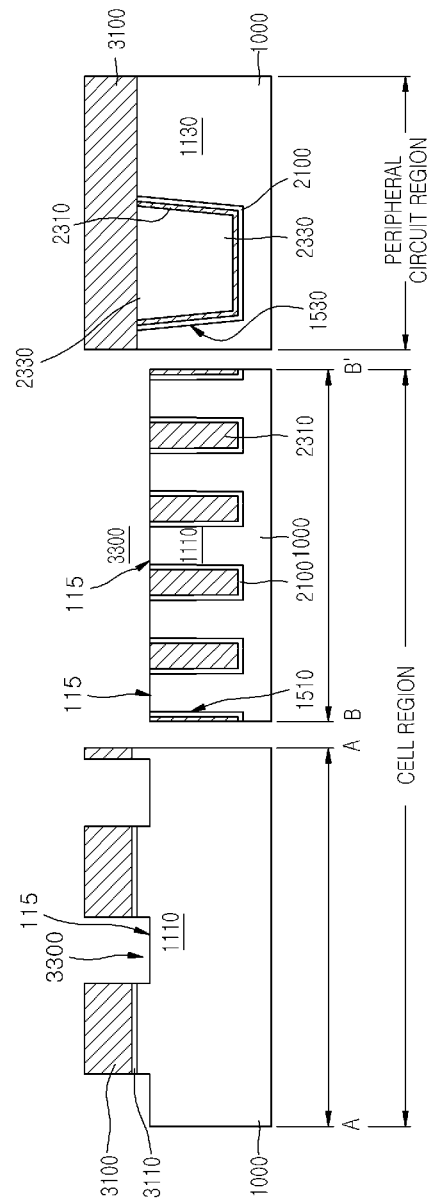

FIG. 37 is a plan view illustrating an array layout of line-shaped contact grooves 3300 in a cell region, and FIG. 38 is a merged cross-sectional view including a cell cross sectional view taken along lines A-A' and B-B' of FIG. 37 and a peripheral circuit cross sectional view.

Referring to FIGS. 37 and 38, after formation of the third interlayer insulation layer 3100, the third interlayer insulation layer 3100 may be patterned to form a plurality of line-shaped contact grooves 3300 in the cell region using the same manners as described with reference to FIGS. 6 and 7. Each of the line-shaped contact grooves 3300 may be designed to have a width which is substantially equal to a sum of a width of each contact pattern 435 and substantially twice a width of each first spacer 431 illustrated in FIG. 16.

Figure 39:
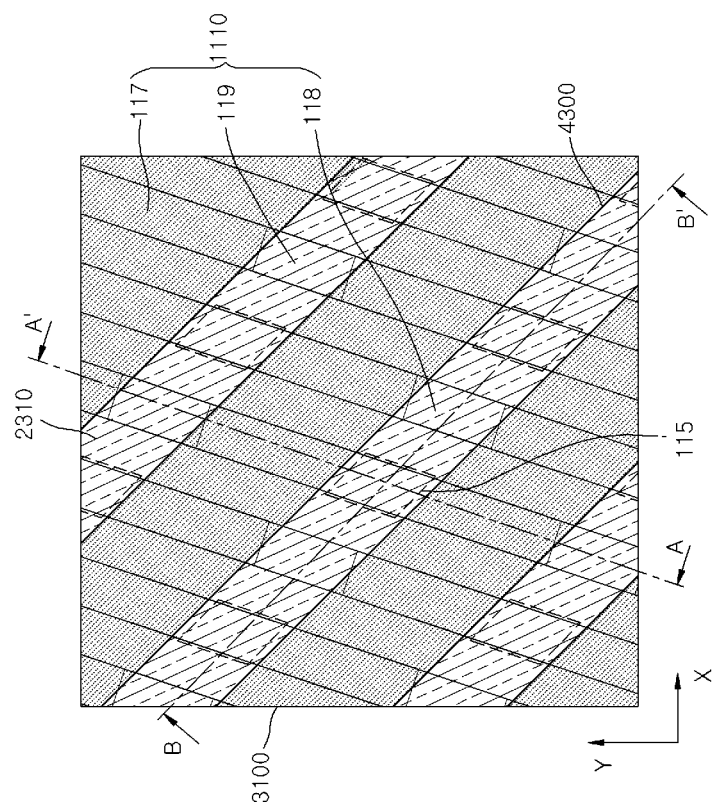
Figure 40:
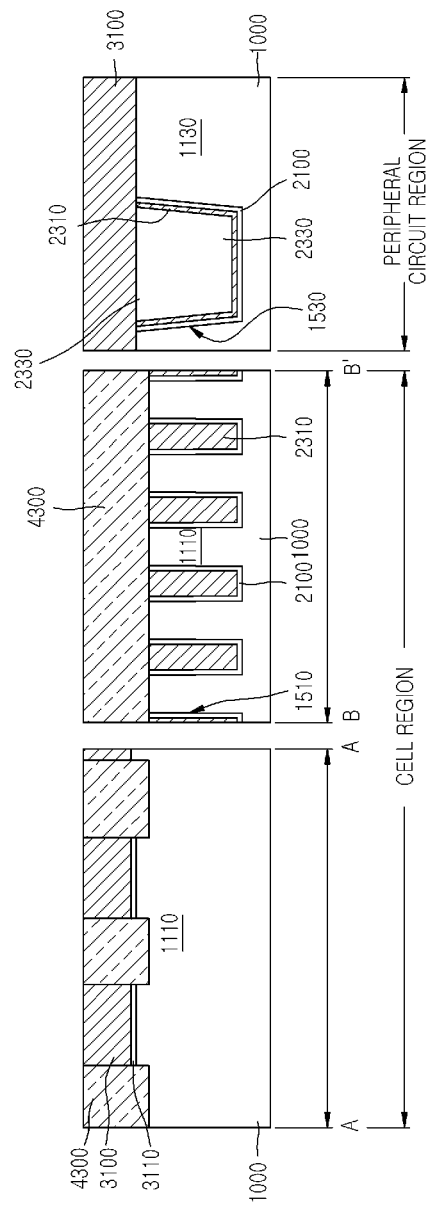

FIG. 39 is a plan view illustrating an array layout of pseudo contact lines 4300 in the cell region, and FIG. 40 is a merged cross-sectional view including a cell cross sectional view taken along lines A-A' and B-B' of FIG. 39 and a peripheral circuit cross sectional view.

Referring to FIGS. 39 and 40, pseudo contact lines 4300 may be formed in respective line-shaped contact grooves 3300 (see FIG. 38) using the same manners as described with reference to FIG. 9. While the contact lines 430 of FIG. 9 are formed with a conductive layer, the pseudo contact lines 4300 may be formed with an insulation layer and may be removed when bit line contacts are formed in a subsequent process. The pseudo contact lines 4300 may be formed to include any insulation material (e.g., a silicon oxide layer) having an etch selectivity with respect to the third interlayer insulation layer 3100 (e.g., a silicon nitride layer).

Figure 41:
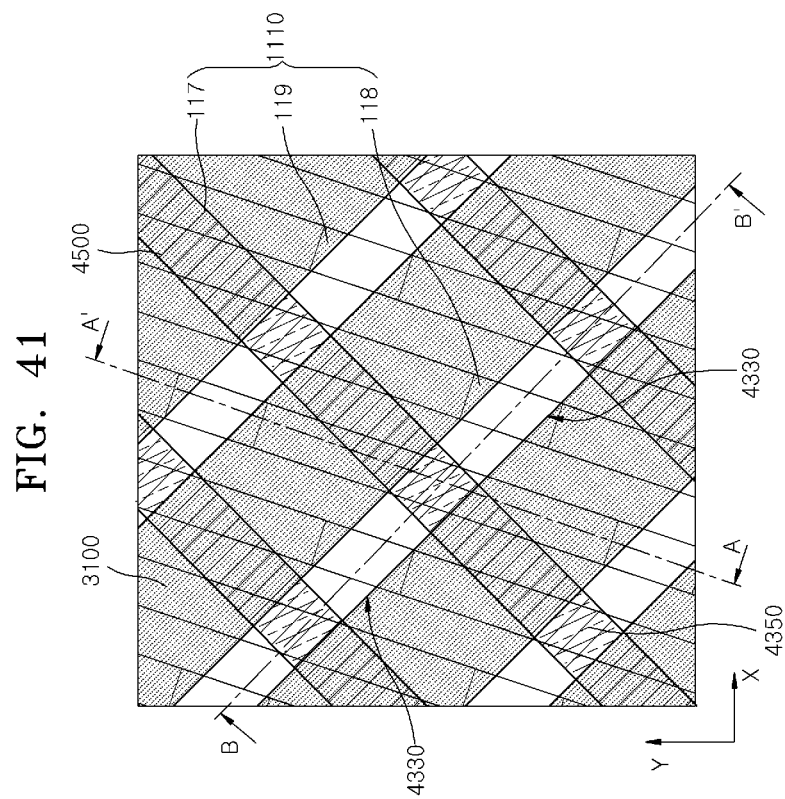
Figure 42:
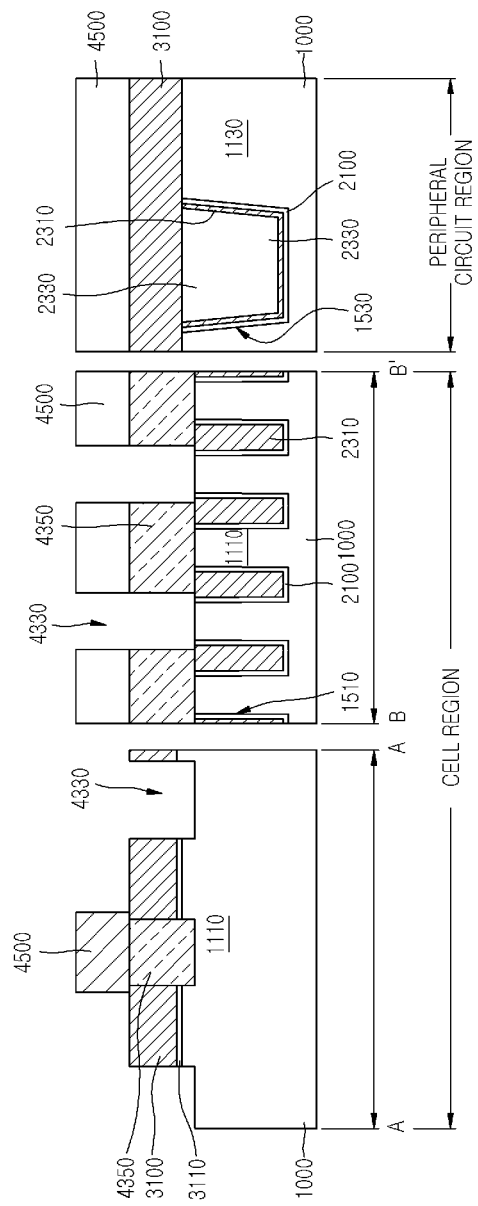

FIG. 41 is a plan view illustrating an array layout of contact separation mask patterns 4500 in the cell region, and FIG. 42 is a merged cross-sectional view including a cell cross sectional view taken along lines A-A' and B-B' of FIG. 41 and a peripheral circuit cross sectional view.

Referring to FIGS. 41 and 42, contact separation mask patterns 4500 (e.g., line-shaped etch mask patterns) may be formed substantially on the substrate including the pseudo contact lines 4300. The contact separation mask patterns 4500 may be formed to generally extend in a direction intersecting the pseudo contact lines 4300. For example, the contact separation mask patterns 4500 may be formed to be generally perpendicular to the pseudo contact lines 4300. That is, the contact separation mask patterns 4500 may be formed using the same manners as described with reference to FIGS. 10 and 11. The contact separation mask patterns 4500 may be formed of an insulation material having an etch selectivity with respect to the pseudo contact lines 4300 (e.g., a silicon oxide layer) and the third interlayer insulation layer 3100 (e.g., a silicon nitride layer). For example, the contact separation mask patterns 4500 may be formed to include an amorphous carbon layer.

As described with reference to FIGS. 10 and 11, the pseudo contact lines 4300 (see FIG. 40) may be etched using the contact separation mask patterns 4500 as an etch mask, thereby forming contact separation grooves 4330. As a result of the etching process applied to the pseudo contact lines 4300, pseudo contact patterns 4350 may be formed generally at intersections between the contact separation mask patterns 4500 and the cell active lines 1110, respectively.

Figure 43:
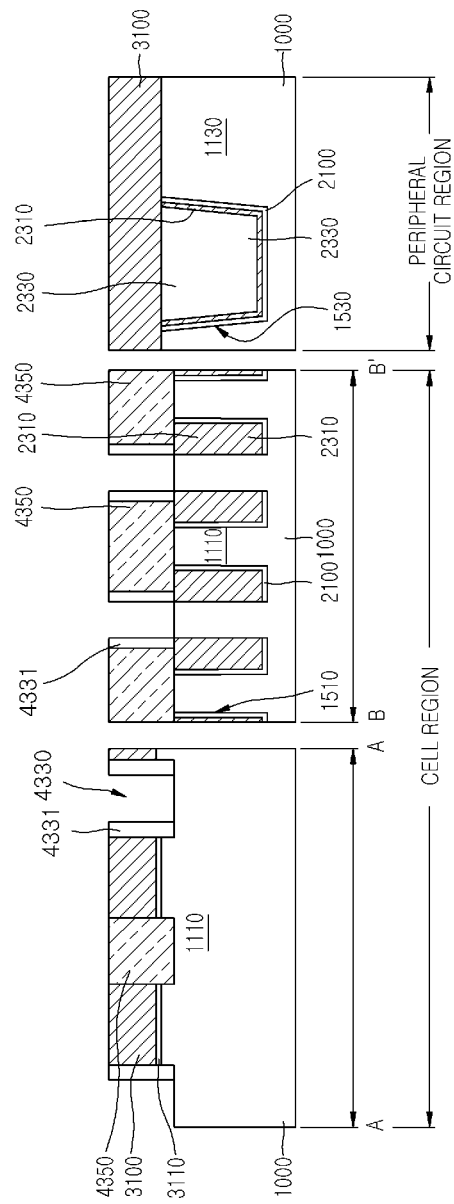

FIG. 43 is a merged cross-sectional view illustrating process steps of forming third spacers 4331 on sidewalls of the contact separation grooves 4330.

Referring to FIG. 43, the contact separation mask patterns 4500 (see FIG. 42) may be substantially removed. Subsequently, a spacer layer may be deposited substantially on the substrate where the contact separation mask patterns 4500 are removed, and the spacer layer may be anisotropically etched to form third spacers 4331 substantially on the sidewalls of the contact separation grooves 4330. A width of the contact separation grooves 4330 may be reduced because of the presence of the third spacers 4331. The contact separation grooves 4330 may correspond to empty spaces where the pseudo contact lines 4300 exposed by the contact separation mask patterns 4500 are selectively removed. Thus, a width of the contact separation grooves 4330 may depend on a width of the pseudo contact lines 4300.

Each of the pseudo contact lines 4300 may be designed to have a width which is substantially equal to the sum of a width of each contact pattern 435 and generally twice the width of each first spacer 431 illustrated in FIG. 16, and each of the contact patterns 435 illustrated in FIG. 16 may be designed to have a width which is substantially equal to a width of each cell active line 1110 having a minor axis direction of the cell active lines 1110. Accordingly, a width of the contact separation grooves 4330 may be greater than the width of the cell active lines 1110. The third spacers 4331 may reduce a substantial width of the contact separation grooves 4330. That is, the third spacers 4331 may reduce the width of active separation grooves that are formed to divide each of the cell active lines 1110 into a plurality of cell active patterns in a subsequent process. The third spacers 4331 may be formed to include an insulation material having an etch selectivity with respect to both a silicon oxide layer and a silicon layer. For example, the third spacers 4331 may be formed to include a silicon nitride layer.

Figure 44:
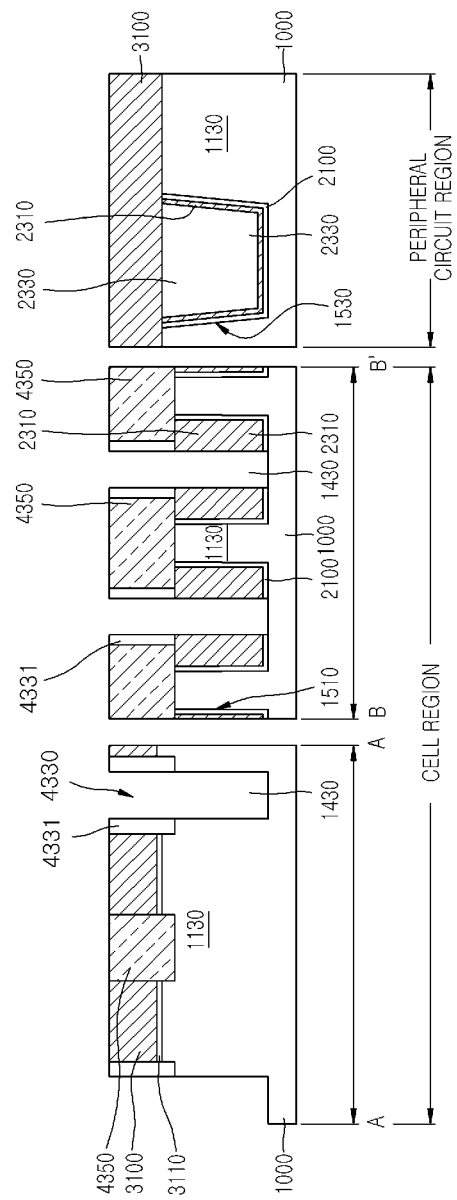

FIG. 44 is a merged cross-sectional view illustrating process steps of forming active separation grooves 1430.

Referring to FIG. 44, using the same manners as described with reference to FIGS. 12 and 13, the cell active lines (1110 of FIG. 43) exposed by the contact separation grooves 4330 may be etched to form active separation grooves 1430. The active separation grooves 1430 may be generally defined by the third interlayer insulation layer 3100, the first isolation layer 2310 exposed by the contact separation grooves 4330, the pseudo contact patterns 4350, and the third spacers 4331.

The pseudo contact patterns 4350 may include an insulation material, as described above. Thus, the contact separation mask patterns 4500 (see FIG. 42) may be removed prior to formation of the active separation grooves 1430. Accordingly, the etching process for forming the active separation grooves 1430 may be performed using an etch recipe that selectively etches the cell active lines 1110 and exhibits an etch selectivity with respect to the third interlayer insulation layer 3100, the first isolation layer 2310, the pseudo contact patterns 4350, and the third spacers 4331. Each of the cell active lines 1110 may be divided into a plurality of cell active patterns 1410 by the active separation grooves 1430.

Figure 45:
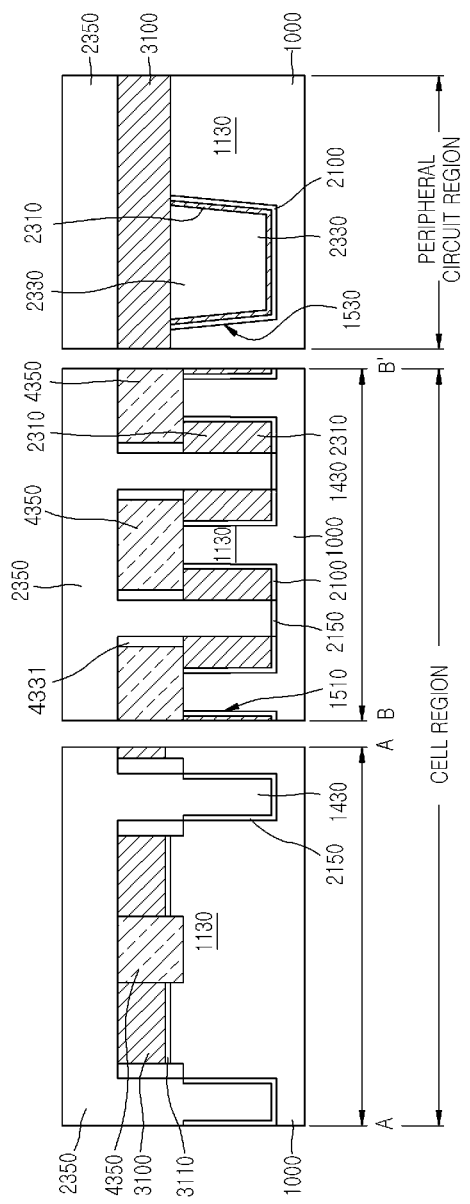

FIG. 45 is a merged cross-sectional view illustrating process steps of forming a third isolation layer 2350 substantially filling the active separation grooves 1430.

Referring to FIG. 45, a third isolation layer 2350 may be formed to substantially fill the active separation grooves 1430 (see FIG. 44). Specifically, a separation groove liner 2150, for example, an insulation layer may be conformed to substantially cover bottom surfaces and sidewalls of the active separation grooves 1430, as described with reference to FIGS. 14 and 15. Subsequently, the third isolation layer 2350, for example, an insulation layer may be formed substantially on the substrate including the separation groove liner 2150. The third isolation layer 2350 may be formed of substantially the same material as the first isolation layer 2310. In an exemplary embodiment, the third isolation layer 2350 may be formed of a silicon nitride layer.

Figure 46:
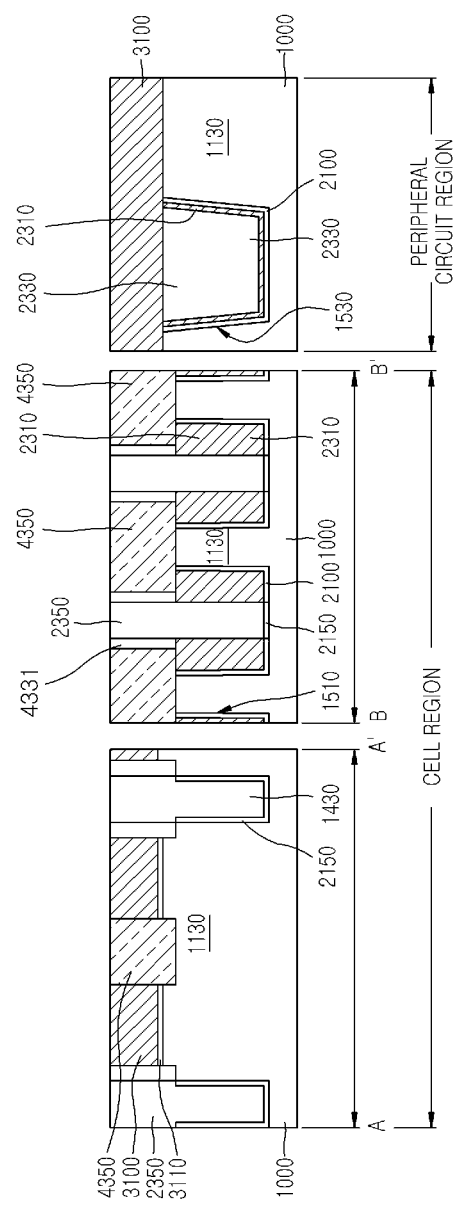

FIG. 46 is a merged cross-sectional view illustrating process steps of exposing top surfaces of the pseudo contact patterns 4350.

Referring to FIG. 46, the third isolation layer 2350 may then be planarized using a chemical mechanical polishing (CMP) process or an etch back process, thereby substantially exposing the top surfaces of the pseudo contact patterns 4350, the third interlayer insulation layer 3100, and the third spacers 4331.

Figure 47:
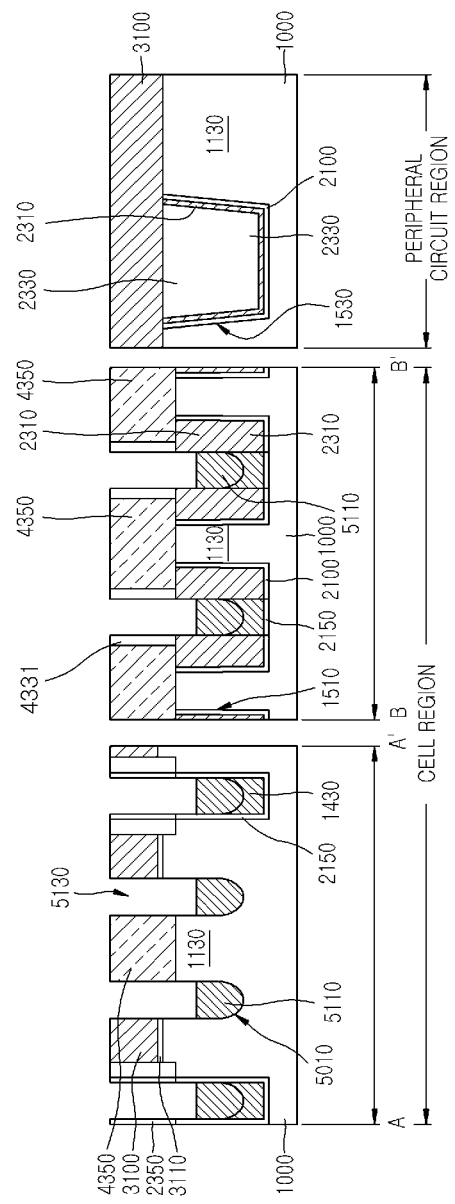

FIG. 47 is a merged cross-sectional view illustrating process steps of forming buried gates 5110.

Referring to FIG. 47, the third interlayer insulation layer 3100 and the cell active patterns 1410 may be etched using the same manners as described with reference to FIGS. 18 and 19, thereby forming a plurality of buried gate grooves 5010 substantially intersecting the cell active patterns 1410. Subsequently, a buried gate layer may be formed to substantially fill the buried gate grooves 5010 using the same manners as described with reference to FIGS. 20 and 21. The buried gate layer may be substantially recessed using the same manners as described with reference to FIGS. 22 and 23, thereby forming buried gates 5110 in respective buried gate grooves 5010. As a result, sealing grooves 5130 may be provided on the respective buried gates 5110.

Figure 48:
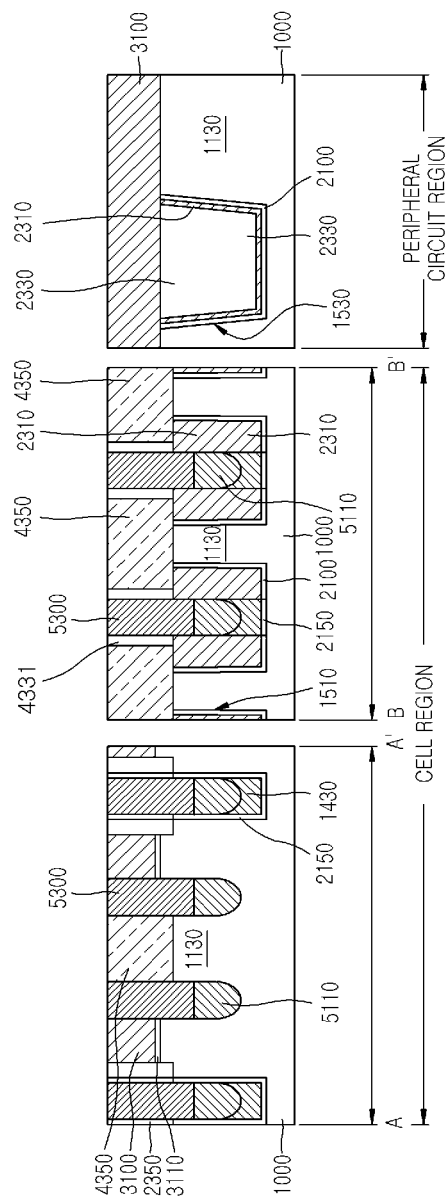

FIG. 48 is a merged cross-sectional view illustrating process steps of forming sealing layers 5300 covering the buried gates 5110.

Referring to FIG. 48, a sealing layer 5300, for example, an insulation layer may be deposited substantially on the substrate including the sealing grooves 5130 (see FIG. 47) using the same manners as described with reference to FIGS. 24 and 25. The sealing layer 5300 may be formed to substantially fill the sealing grooves 5130. The sealing layer 5300 may be formed to include an insulation material (e.g., a silicon nitride layer) having an etch selectivity with respect to the pseudo contact patterns 4350 to protect the buried gates 5110 when a subsequent etching process is performed. The sealing layer 5300 may be then planarized to substantially expose top surfaces of the pseudo contact patterns 4350.

Figure 49:
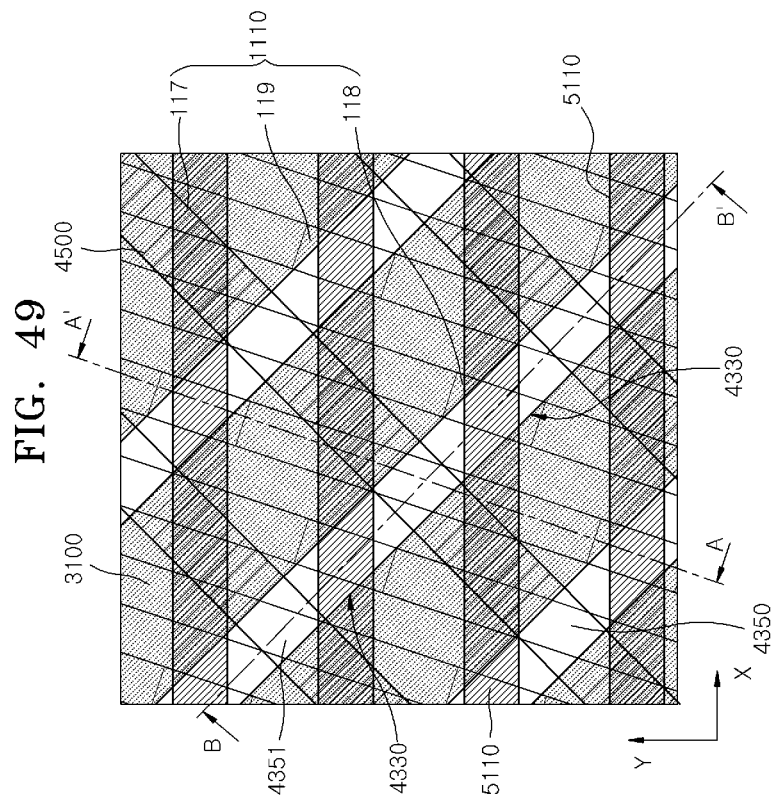
Figure 50:
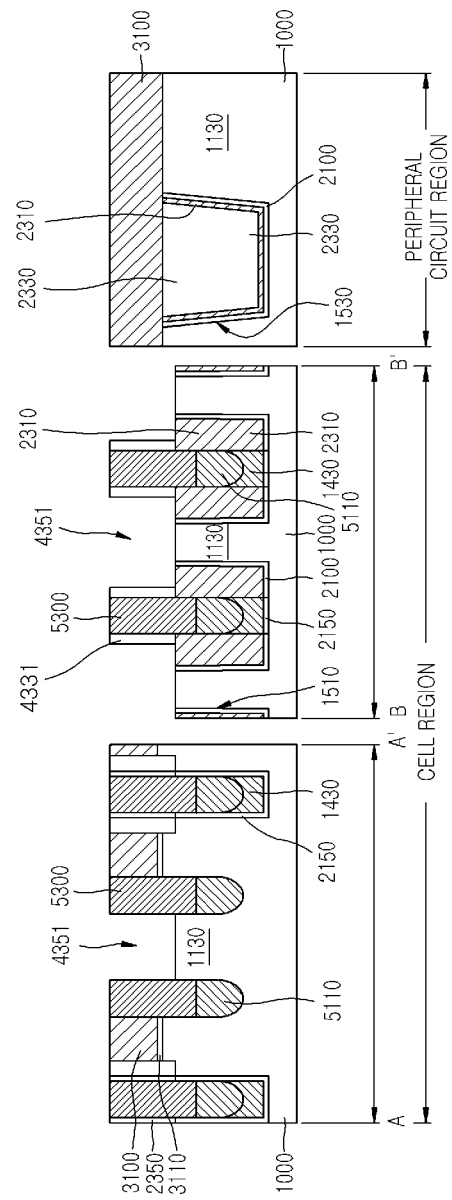

FIG. 49 is a plan view illustrating an array layout of contact holes 4351 in the cell region, and FIG. 50 is a merged cross-sectional view including a cell cross sectional view taken along lines A-A' and B-B' of FIG. 49 and a peripheral circuit cross sectional view.

Referring to FIGS. 49 and 50, the exposed pseudo contact patterns 4350 may be selectively removed to form contact holes 4351. The contact holes 4351 may substantially expose central portions of the cell active patterns 1410 and may function as bit lines contact holes.

Figure 51:
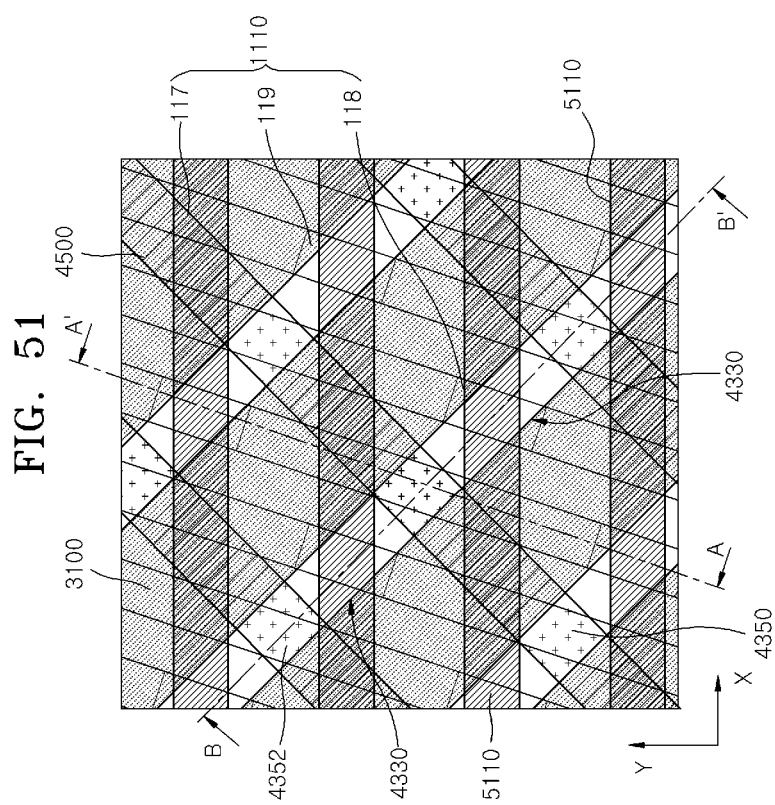
Figure 52:
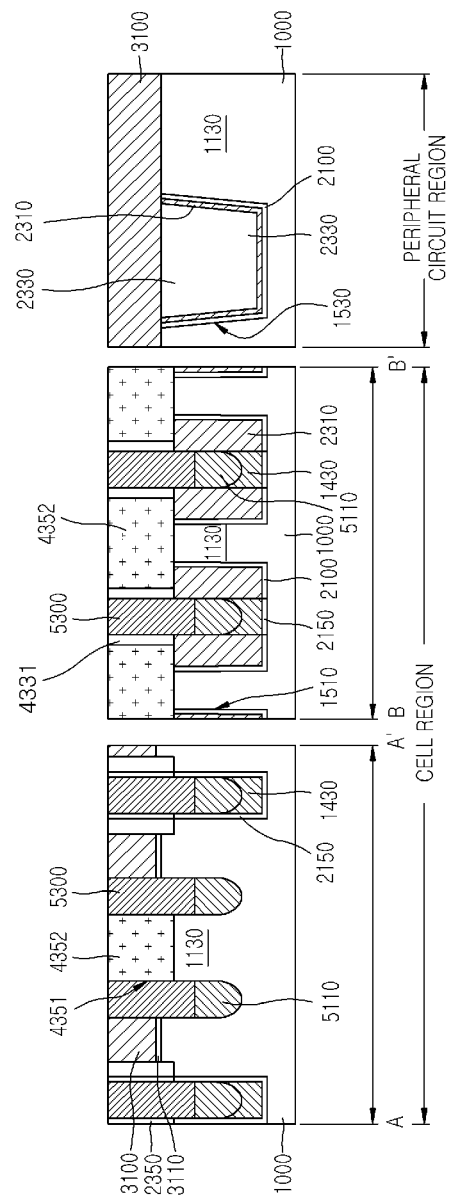

FIG. 51 is a plan view illustrating an array layout of contact patterns 4352 in the cell region, and FIG. 52 is a merged cross-sectional view including a cell cross sectional view taken along lines A-A' and B-B' of FIG. 51 and a peripheral circuit cross sectional view.

Referring to FIGS. 51 and 52, a conductive layer, for example, a doped polysilicon layer or a metal layer may be formed to substantially fill the contact holes 4351, and the conductive layer may be planarized to form contact patterns 4352 in respective contact holes 4351.

Figure 53:
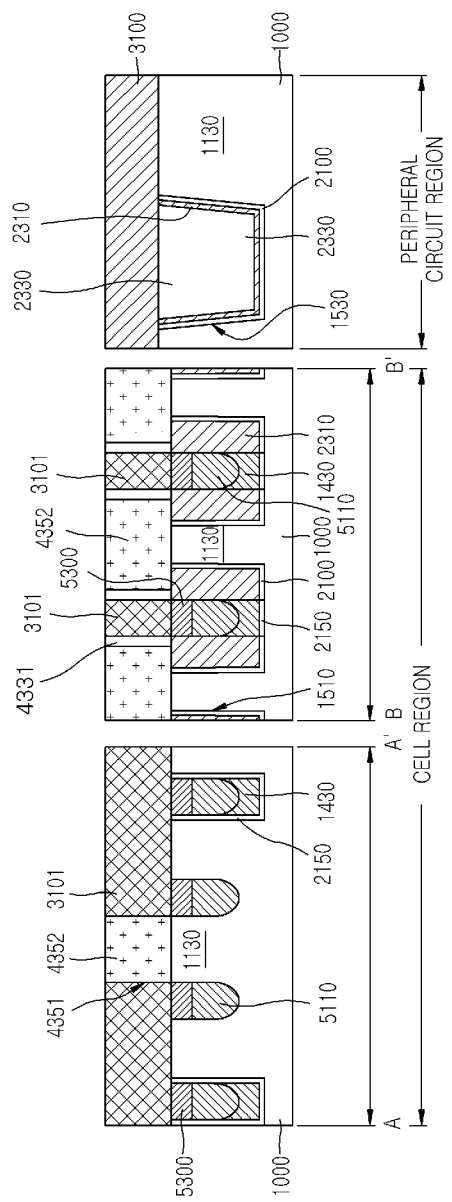

FIG. 53 is a merged cross-sectional view illustrating process steps of forming a fourth interlayer insulation layer 3101.

Referring to FIG. 53, after formation of the contact patterns 4352, the third interlayer insulation layer 3100 in the cell region may be selectively removed. In the event that the third interlayer insulation layer 3100, the third spacers 4331 and the sealing layer 5300 may be formed of the same material (e.g., a silicon nitride layer), the third spacers 4331 and the sealing layer 5300 may be partially or entirely removed while the third interlayer insulation layer 3100 in the cell region is selectively removed.

Subsequently, a fourth interlayer insulation layer 3101, for example, a silicon oxide layer may be formed on the substrate where the third interlayer insulation layer 3100 in the cell region is selectively removed. The fourth interlayer insulation layer 3101 may then be planarized to substantially expose the top surfaces of the contact patterns 4352.

Figure 54:
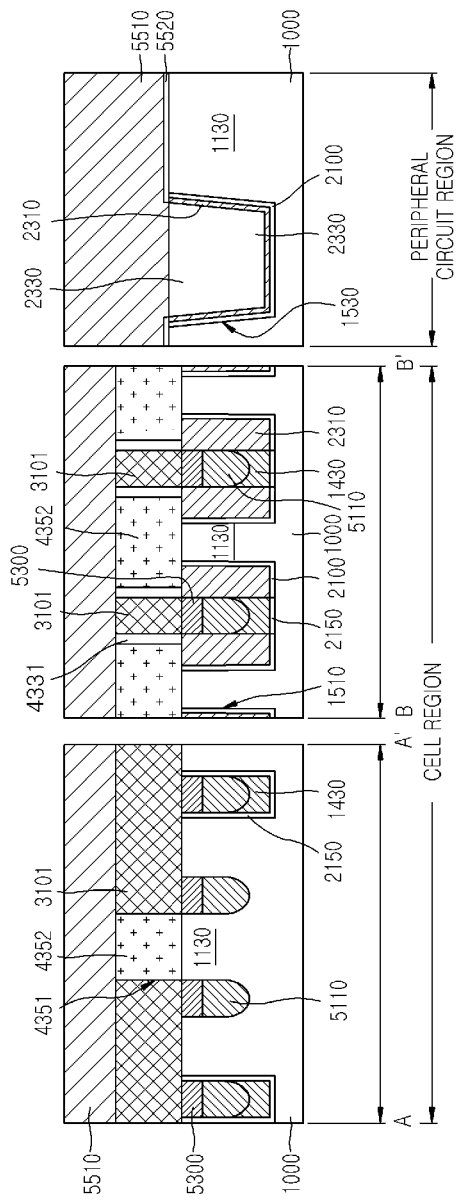

FIG. 54 is a merged cross-sectional view illustrating process steps of forming a first peripheral gate layer 5510.

Referring to FIG. 54, the third interlayer insulation layer (3100 of FIG. 53) remaining in the peripheral circuit region may be selectively removed to substantially expose the peripheral active patterns 1130 in the peripheral circuit region. A peripheral gate dielectric layer 5520, for example, a silicon oxide layer may be substantially formed on the exposed peripheral active patterns 1130, and a first peripheral gate layer 5510 may be substantially formed on the substrate including the peripheral gate dielectric layer 5520.

Figure 55:
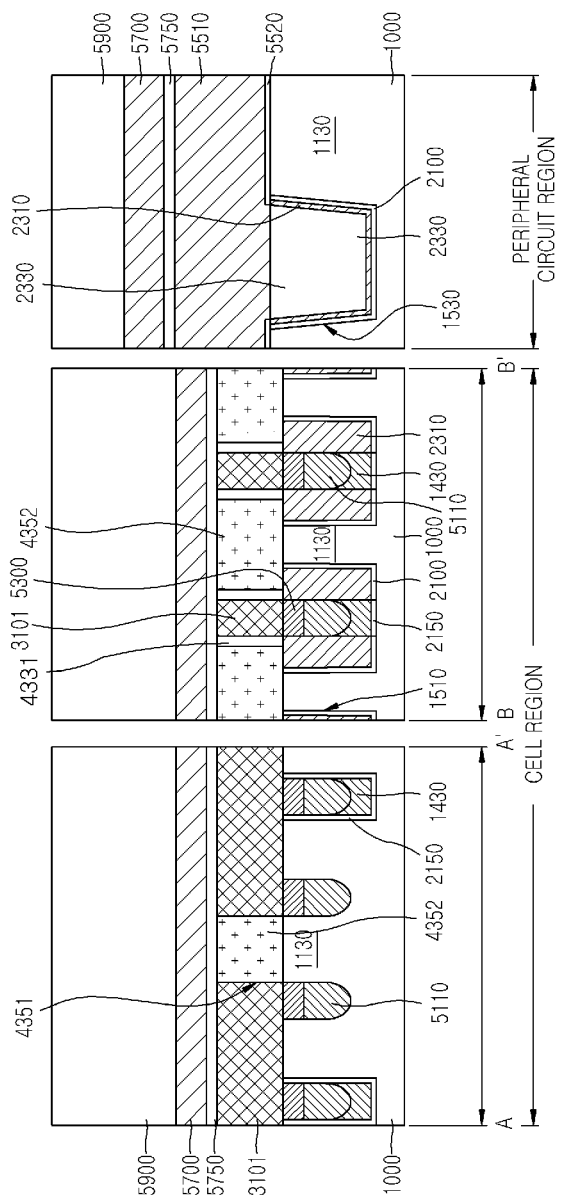

FIG. 55 is a merged cross-sectional view illustrating process steps of forming a bit line layer 5700.

Referring to FIG. 55, the first peripheral gate layer 5510 in the cell region may be selectively removed to substantially expose top surfaces of the contact patterns 4352 and the fourth interlayer insulation layer 3101. A first barrier metal layer 5750, a bit line layer 5700 and a bit line capping layer 5900 may be sequentially formed on the substrate where the first peripheral gate layer 5510 in the cell region is selectively removed.

Figure 56:
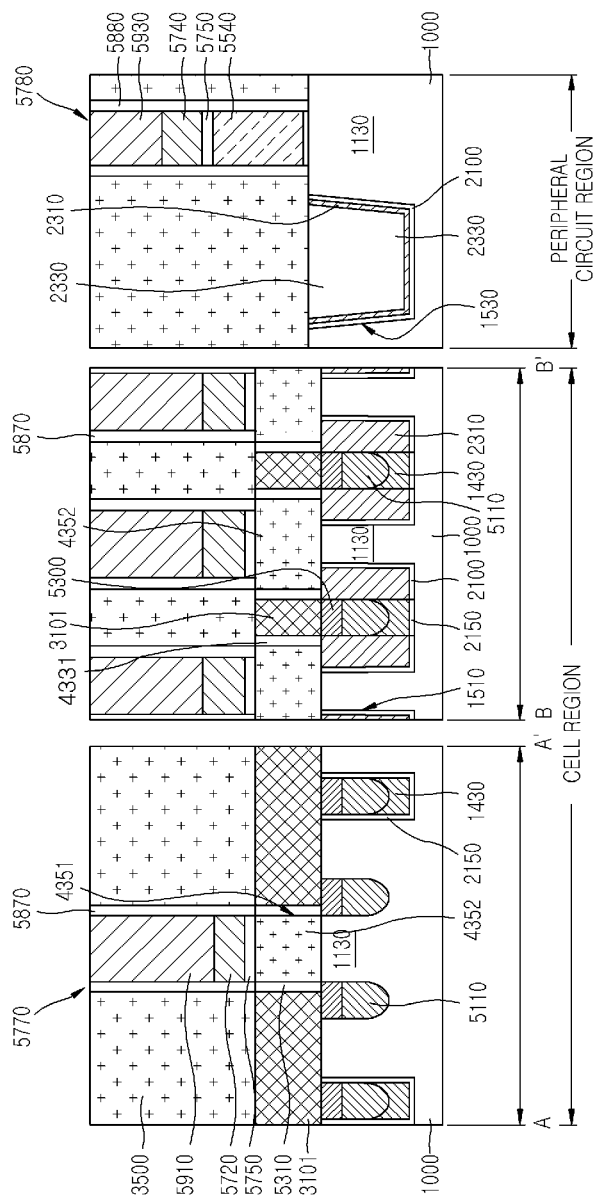

FIG. 56 is a merged cross-sectional view illustrating process steps of forming bit line stacks 5770 and at least one peripheral gate stack 5780.

Referring to FIG. 56, the bit line capping layer 5900 (see FIG. 55), the bit line layer 5700 (see FIG. 55), the first barrier metal layer 5750 and the first peripheral gate layer 5510 (see FIG. 55) may be patterned to form bit line stacks 5770 in the cell region and at least one peripheral gate stack 5780 in the peripheral circuit region. Accordingly, each of the bit line stacks 5770 may be formed to include a first barrier metal pattern 5750, a bit line 5720, and a bit line capping pattern 5910 which are sequentially stacked. Further, the peripheral gate stack 5780 may be formed to include a first peripheral gate 5540, a first barrier metal pattern 5750, a second peripheral gate 5740, and a peripheral gate capping pattern 5930 which are sequentially stacked.

As described with reference to FIGS. 28 and 29, the bit line stacks 5770 and the peripheral gate stack 5780 may be independently formed using two separated patterning processes.

Alternatively, the bit line stacks 5770 and the peripheral gate stack 5780 may be simultaneously formed or formed generally at the same time using a single patterning process that includes a single exposure process and a single etching process, as described with reference to FIGS. 28 and 29.

Using the same manners as described with reference to FIG. 30, bit line spacers 5870 may be formed substantially on the sidewalls of the bit line stacks 5770 and peripheral gate spacers 5880 may be formed substantially on the sidewalls of the peripheral gate stack 5780.

A sixth interlayer insulation layer 3500 may be formed to substantially fill spaces between the bit line stacks 5770 as well as generally between the peripheral gate stacks 5780, as described with reference to FIG. 31. Thus, an interlayer insulation layer stacked on both ends of each of the cell active patterns 1410 may include the fourth interlayer insulation layer 3101 and the sixth interlayer insulation layer 3500, and both the fourth interlayer insulation layer 3101 and the sixth interlayer insulation layer 3500 may be formed to include a silicon oxide layer. Each of the contact patterns 4352 may be substantially surrounded by the fourth interlayer insulation layer 3101, for example, a silicon oxide layer. In contrast, each of the contact patterns 435 illustrated in FIG. 31 may be substantially surrounded by the sealing layer 530, for example, a silicon nitride layer.

Figure 57:
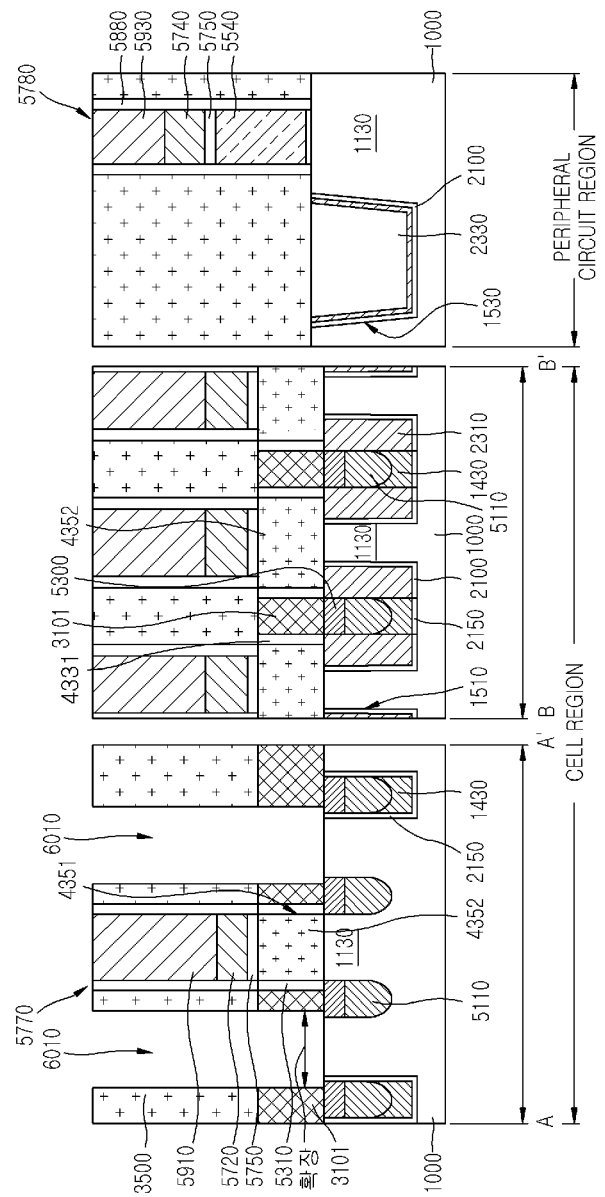

FIG. 57 is a merged cross-sectional view illustrating process steps of forming storage node contact holes 6010 in the cell region.

Referring to FIG. 57, using the same or similar manner as described with reference to FIGS. 32 and 33, the sixth interlayer insulation layer 3500 and the fourth interlayer insulation layer 3101 may be patterned to from storage node contact holes 6010 that substantially expose both ends of each of the cell active patterns 1410. The storage node contact holes 6010 may be formed to be generally self-aligned with the bit line stacks 5770. After the storage node contact holes 6010 are formed using a dry etching process, the storage node contact holes 6010 may be generally enlarged using a wet etching process. The wet etching process may be performed using an oxide etchant such as a diluted hydrofluoric (HF) acid solution. Thus, the storage node contact holes 6010 may be generally widened to increase widths thereof. That is, the widened storage node contact holes 6010 may laterally extend onto edges of the sealing layers 5300 to maximize the exposed areas of the cell active patterns 1410. As a result, contact areas of the cell active patterns 1410 may be maximized.

FIG. 58 is a merged cross-sectional view illustrating process steps of forming storage node contacts 6100 in the cell region.

Referring to FIG. 58, using the same or similar manners as described with reference to FIG. 34, storage node contacts 6100 may be formed in respective widened storage node contact holes 6010 and storage nodes 6300 may be formed on respective storage node contacts 6100.

The embodiments of the inventive concepts have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A method of fabricating a semiconductor device, the method comprising:
    forming a first isolation layer in a semiconductor substrate to define active lines;

forming contact lines generally crossing over the active lines and a first interlayer insulation layer substantially filling spaces between the contact lines;

forming line-shaped etch mask patterns generally crossing over the active lines and the contact lines;

etching the contact lines exposed by the line-shaped etch mask patterns to form contact separation grooves and to form contact patterns generally remaining at intersections between the line-shaped etch mask patterns and the active lines;

etching the active lines exposed by the contact separation grooves to form active separation grooves that generally divide each of the active lines into a plurality of active patterns;

forming a third isolation layer substantially filling the active separation grooves;

forming gates that substantially intersect the active patterns; and forming bit lines generally crossing over the gates.

2. The method of claim 1, wherein forming the first isolation layer includes:

obtaining an array layout of the active lines, a layout of each active line including active portions corresponding to the active patterns arrayed along a single line and separation portions corresponding to the active separation grooves between the active patterns;

transferring the array layout of the active lines onto the semiconductor substrate to form a trench etch mask;

etching the semiconductor substrate using the trench etch mask as an etch mask to form trenches; and forming insulation layers in respective trenches.

3. The method of claim 2:

wherein odd-numbered contact lines among the contact lines generally cross over the contact lines to substantially overlap with the separation portions of odd-numbered active lines among the active lines and to substantially overlap with central portions of even-numbered active lines among the active lines; and wherein even-numbered contact lines among the contact lines generally cross over the contact lines to overlap with the separation portions of even-numbered active lines among the active lines and to generally overlap with central portions of odd-numbered active lines among the active lines.

4. The method of claim 3, wherein the line-shaped etch mask patterns generally expose portions of the contact lines that overlap with the separation portions of the active lines.

5. The method of claim 2, wherein layouts of the active lines are generated to generally extend in a diagonal or crosswise direction with both the gates and the bit lines and to intersect both the gates and the bit lines.

6. The method of claim 5, wherein forming the trench etch mask is performed using a spacer patterning technology (SPT), a double patterning technology (DPT), a double exposure technology (DET), a lithography-lithography-etch (LLE) technology or a lithography-etch-lithography-etch (LELE) technology.

7. The method of claim 2, wherein forming the insulation layers in respective trenches includes:

depositing a silicon nitride layer substantially filling the trenches; and planarizing the silicon nitride layer.

8. The method of claim 1, wherein forming the contact lines includes:

forming a first interlayer insulation layer substantially on the semiconductor substrate including the first isolation layer;

etching the first interlayer insulation layer to form line-shaped contact grooves; and forming a conductive layer substantially filling the line-shaped contact grooves.

9. The method of claim 8, wherein the conductive layer filling the line-shaped contact grooves is formed to include a doped polysilicon layer or a metal layer.

10. The method of claim 1:

wherein the line-shaped etch mask patterns are formed to expose portions of the first interlayer insulation layer located substantially between the contact lines; and wherein the contact separation grooves are formed by selectively etching portions of the contact lines which are exposed by the line-shaped etch mask patterns.

11. The method of claim 1, wherein the active separation grooves are formed to be self-aligned with the first isolation layer and the first interlayer insulation layer.

12. The method of claim 1, wherein forming the third isolation layer includes:

forming a silicon nitride layer substantially filling the active separation grooves and the contact separation grooves; and recessing the silicon nitride layer to substantially reform the contact separation grooves.

13. The method of claim 12, further comprising forming a second interlayer insulation layer that substantially fills the reformed contact separation grooves.

14. The method of claim 1, wherein forming the gates includes:

etching the first interlayer insulation layer and the active patterns to form generally line-shaped buried gate grooves substantially intersecting the active patterns;

forming a buried gate layer substantially filling the buried gate grooves;

recessing the buried gate layer to form buried gates in respective buried gate grooves and to provide sealing grooves substantially on respective buried gates; and forming sealing layers substantially in respective sealing grooves.

15. The method of claim 1, wherein forming the bit lines includes:

forming a bit line layer substantially connected to the contact patterns on the substrate including the gates;

depositing an insulation layer substantially on the bit line layer to form a bit line capping layer; and patterning the bit line capping layer and the bit line layer.

16. The method of claim 1, further comprising:

forming a third interlayer insulation layer substantially filling spaces between the bit lines;

forming storage node contacts that penetrate the third interlayer insulation layer and the first interlayer insulation layer to be connected to the active patterns; and forming storage nodes connected to the storage node contacts.

17. A method of fabricating a semiconductor device, the method comprising:

forming a first isolation layer in a semiconductor substrate to define active lines;

forming pseudo contact lines generally crossing over the active lines and a first interlayer insulation layer substantially filling spaces between the pseudo contact lines;

forming line-shaped etch mask patterns generally crossing over the active lines and the pseudo contact lines;

etching the pseudo contact lines exposed by the line-shaped etch mask patterns to form contact separation grooves and to form pseudo contact patterns generally remaining at intersections between the line-shaped etch mask patterns and the active lines;

etching the active lines exposed by the contact separation grooves to form active separation grooves that generally divide each of the active lines into a plurality of active patterns;

forming a third isolation layer substantially filling the active separation grooves;

forming gates that substantially intersect the active patterns;

removing the pseudo contact patterns to form contact holes;

forming contact patterns substantially filling the contact holes; and forming bit lines connected to the contact patterns.

18. The method of claim 17, wherein forming the pseudo contact lines includes:

forming a first interlayer insulation layer substantially on the substrate including the first isolation layer;

etching the first interlayer insulation layer to form line-shaped contact grooves; and filling the line-shaped contact grooves with a different insulation layer from the first interlayer insulation layer.

19. The method of claim 17:

wherein the first interlayer insulation layer is formed to include a silicon nitride layer and the pseudo contact lines are formed to include a silicon oxide layer; and wherein the line-shaped etch mask patterns are formed to include an amorphous carbon layer different from the first interlayer insulation layer.

20. The method of claim 17, further comprising forming spacers generally on sidewalls of the contact separation grooves after formation of the contact separation grooves, wherein the active separation grooves are formed to be self-aligned with the spacers and the first isolation layer exposed by the contact separation grooves.

21. The method of claim 20, wherein the spacers are formed to include substantially the same material as the first isolation layer.

22. The method of claim 17, wherein forming the third isolation layer includes:

forming a silicon nitride layer substantially filling the active separation grooves and the contact separation grooves; and planarizing the silicon nitride layer to substantially expose top surfaces of the pseudo contact patterns.

23. The method of claim 17, wherein forming the contact patterns is followed by:

recessing the first interlayer insulation layer and the third isolation layer to substantially expose sidewalls of the contact patterns; and filling spaces between the exposed sidewalls of the contact patterns with a second interlayer insulation layer including a different material from the third isolation layer.

24. The method of claim 23, wherein the second interlayer insulation layer is formed to include a silicon oxide layer.

25. The method of claim 17, wherein forming the gates includes:

etching the first interlayer insulation layer and the active patterns to form generally line-shaped buried gate grooves substantially intersecting the active patterns;

forming a buried gate layer substantially filling the buried gate grooves;

recessing the buried gate layer to form buried gates in respective buried gate grooves and to provide sealing grooves substantially on respective buried gates; and forming sealing layers substantially in respective sealing grooves.

26. A method of fabricating a semiconductor device, the method comprising:

forming a first isolation layer in a semiconductor substrate to define cell active lines in a cell region of the semiconductor substrate and to define a peripheral active region in a peripheral circuit region of the semiconductor substrate;

forming contact lines that generally cross over the cell active lines and a first interlayer insulation layer that substantially fills spaces between the contact lines and substantially covers the peripheral circuit region;

forming line-shaped etch mask patterns generally crossing over the cell active lines and generally crossing over the contact lines in the cell region;

etching the contact lines exposed by the line-shaped etch mask patterns to form contact separation grooves and to form contact patterns remaining at intersections between the line-shaped etch mask patterns and the cell active lines;

etching the cell active lines exposed by the contact separation grooves to form active separation grooves that generally divide each of the cell active lines into a plurality of cell active patterns;

forming a third isolation layer filling the active separation grooves;

forming buried gates that substantially intersect the cell active patterns;

selectively removing the first interlayer insulation layer in the peripheral circuit region to substantially expose the peripheral active region;

forming a first peripheral gate layer substantially on the peripheral circuit region including the exposed peripheral active region;

forming a bit line layer electrically connected to the contact patterns on an entire surface of the substrate including the first peripheral gate layer; and patterning the bit line layer and the first peripheral gate layer to form bit lines connected to the contact patterns in the cell region and to form a peripheral gate including a first peripheral gate and a second peripheral gate in the peripheral circuit region, wherein the first peripheral gate is a portion of the first peripheral gate layer and the second peripheral gate is a portion of the bit line layer.

27. The method of claim 26, wherein the first peripheral gate layer is formed to include a doped polysilicon layer and the bit line layer is formed to include a metal layer.

28. A method of fabricating a semiconductor device, the method comprising:

forming a first isolation layer in a semiconductor substrate to define cell active lines in a cell region of the semiconductor substrate and to define a peripheral active region in a peripheral circuit region of the semiconductor substrate;

forming pseudo contact lines that generally cross over the cell active lines and a first interlayer insulation layer that substantially fills spaces between the pseudo contact lines and substantially covers the peripheral circuit region;

forming line-shaped etch mask patterns generally crossing over the cell active lines and generally crossing over the pseudo contact lines in the cell region;

etching the pseudo contact lines exposed by the line-shaped etch mask patterns to form contact separation grooves and to form pseudo contact patterns remaining at intersections substantially between the line-shaped etch mask patterns and the cell active lines;

etching the cell active lines exposed by the contact separation grooves to form active separation grooves that generally divide each of the cell active lines into a plurality of cell active patterns;

forming a third isolation layer filling the active separation grooves;

forming buried gates that substantially intersect the cell active patterns;

selectively removing the pseudo contact patterns to form contact holes;

forming contact patterns substantially filling the contact holes;

selectively removing the first interlayer insulation layer in the peripheral circuit region to substantially expose the peripheral active region;

forming a first peripheral gate layer on the peripheral circuit region including the exposed peripheral active region;

forming a bit line layer electrically connected to the contact patterns on an entire surface of the substrate including the first peripheral gate layer; and patterning the bit line layer and the first peripheral gate layer to form bit lines connected to the contact patterns in the cell region and to form a peripheral gate including a first peripheral gate and a second peripheral gate in the peripheral circuit region, wherein the first peripheral gate is a portion of the first peripheral gate layer and the second peripheral gate is a portion of the bit line layer.

29. A method of fabricating a semiconductor device, the method comprising:

forming active lines in a semiconductor substrate;

forming contact lines substantially crossing over the active lines;

forming line-shaped etch mask patterns substantially crossing over the active lines and the contact lines;

etching the contact lines exposed by the line-shaped etch mask patterns to form contact separation grooves and to form contact patterns remaining at intersections substantially between the line-shaped etch mask patterns and the active lines;

etching the active lines exposed by the contact separation grooves to form active separation grooves that generally divide each of the active lines into a plurality of active patterns;

forming gates that substantially intersect the active patterns; and forming bit lines electrically connected to the contact patterns.

* * * * *